(12) United States Patent
Takemura

(10) Patent No.: US 11,978,812 B2
(45) Date of Patent: May 7, 2024

(54) WAVEGUIDE PHOTODETECTOR

(71) Applicant: Mitsubishi Electric Corporation, Tokyo (JP)

(72) Inventor: Ryota Takemura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/785,318

(22) PCT Filed: Feb. 26, 2020

(86) PCT No.: PCT/JP2020/007584
§ 371 (c)(1),
(2) Date: Jun. 14, 2022

(87) PCT Pub. No.: WO2021/171393
PCT Pub. Date: Sep. 2, 2021

(65) Prior Publication Data
US 2023/0055105 A1    Feb. 23, 2023

(51) Int. Cl.
*H01L 31/0232* (2014.01)
*H01L 31/103* (2006.01)

(52) U.S. Cl.
CPC .... *H01L 31/02327* (2013.01); *H01L 31/1035* (2013.01)

(58) Field of Classification Search
CPC .......... H01L 31/02327; H01L 31/1035; H01L 31/02161; H01L 31/035272; H01L 31/109
See application file for complete search history.

(56) References Cited

U.S. PATENT DOCUMENTS

| | | |
|---|---|---|
| 6,417,528 B1 | 7/2002 | Bond |
| 2002/0195616 A1* | 12/2002 | Bond .................. H01L 31/1075 257/E31.064 |

(Continued)

FOREIGN PATENT DOCUMENTS

| | | |
|---|---|---|
| CN | 1327272 A | 12/2001 |
| CN | 101207162 A | 6/2008 |

(Continued)

OTHER PUBLICATIONS

Xiaowei Li et al., "A partially depleted absorber photodiode with graded doping injection regions," in IEEE Photonics Technology Letters, vol. 16, No. 10, pp. 2326-2328, Oct. 2004, doi: 10.1109/LPT.2004.834563 (Year: 2004).*

(Continued)

*Primary Examiner* — Sitaramarao S Yechuri
(74) *Attorney, Agent, or Firm* — Studebaker & Brackett PC

(57) ABSTRACT

A waveguide photodetector includes a first contact layer of a first conductivity type, a waveguide layer, and a second contact layer of a second conductivity type that are sequentially formed on the semiconductor substrate. The waveguide layer includes a first cladding layer of the first conductivity type disposed on a side of the first contact layer, a second cladding layer of the second conductivity type disposed on a side of the second contact layer, and the core layer disposed between the first cladding layer and the second cladding layer. The core layer includes a light absorption layer and an impurity-doped light absorption layer that has a higher concentration of a p-type impurity than that of the light absorption layer and is disposed on a side of a light incident face.

20 Claims, 18 Drawing Sheets

(56) References Cited

U.S. PATENT DOCUMENTS

| | | | | |
|---|---|---|---|---|
| 2008/0144994 | A1* | 6/2008 | Nakaji | H01L 31/0352 |
| | | | | 438/69 |
| 2009/0321868 | A1 | 12/2009 | Nakaji | |
| 2010/0032008 | A1* | 2/2010 | Adekore | G02B 6/12004 |
| | | | | 117/88 |
| 2010/0216275 | A1* | 8/2010 | Doerr | H01L 31/1035 |
| | | | | 438/69 |

FOREIGN PATENT DOCUMENTS

| | | |
|---|---|---|
| JP | H11-340497 A | 12/1999 |
| JP | 2010-010450 A | 1/2010 |
| JP | 5294558 B2 | 9/2013 |

OTHER PUBLICATIONS

An Office Action; mailed by the State Intellectual Property Office of the People's Republic of China dated Jun. 21, 2023, which corresponds to Chinese Patent Application No. 202080097215.3 and is related to U.S. Appl. No. 17/785,318.

International Search Report issued in PCT/JP2020/007584; dated Apr. 21, 2020.

An Office Action; mailed by the State Intellectual Property Office of the People's Republic of China dated Nov. 22, 2023, which corresponds to Chinese Patent Application No. 202080097215.3 and is related to U.S. Appl. No. 17/785,318.

An Office Action mailed by the State Intellectual Property Office of the People's Republic of China on Feb. 29, 2024, which corresponds to Chinese Patent Application No. 202080097215.3 and is related to U.S. Appl. No. 17/785,318.

* cited by examiner

WAVEGUIDE PHOTODETECTOR

TECHNICAL FIELD

The present application relates to a waveguide photodetector.

BACKGROUND ART

With the dramatic increase in the communication capacity in optical communications, the capacity of communication systems has been increased. Therefore, there is a need to increase the speed of an optical communication device. In a photodiode, which is a semiconductor photodetector used in an optical communication device, a CR time constant depending on a capacitance C of the detector and a resistance R of the detector is one of factors that determines the response speed. In order to increase the response speed of the photodiode, it is necessary to reduce the CR time constant. Thus, it is important to reduce the capacitance C of the detector.

As a technique for reducing the capacitance C of the detector and obtaining fast response of, for example, 40 GHz or more, a waveguide photodetector is adopted. The waveguide photodetector has a structure in which light is incident from the side face of the epitaxial layer and has a structure suitable for high-speed operation because the sensitivity and the frequency band can be individually optimized unlike a normal plane incidence type structure.

Patent Document 1 discloses a waveguide type semiconductor photodetector (waveguide photodetector) provided with a window structure devised to reduce surface recombination at an end face where light is incident. The waveguide type semiconductor photodetector of Patent Document 1 is provided with a light absorption waveguide layer (light absorption layer) for guiding light while absorbing the light, and the light absorption waveguide layer in the window structure corresponds to a non-natural superlattice region.

CITATION LIST

Patent Document

Patent Document 1: Japanese Patent Application Publication Laid-open No. H11-340497 (FIG. 1, FIG. 2)

SUMMARY OF INVENTION

Problems to be Solved by Invention

In a waveguide photodetector in which light is directly incident on the light absorption layer, the size of the light receiving region is typically smaller than that of the plane incidence type photodetector, and the light is concentrated on the end face on the side w % here the light is incident. Therefore, a large number of photocarriers are generated on the side of the front end face (light incident face) where light is incident in the light absorption layer. Among the generated photocarriers, caused by the reverse bias applied to the photodiode, holes move to the anode side with the negative potential and the electrons move to the cathode side with the positive potential. The larger the power of light input to the photodiode, namely, the larger the light input power, the more the photocarriers are generated. If the number of generated photocarriers is large, sufficient electric field strength cannot be obtained due to the space charge effect, and thus the photocarriers cannot be extracted at high speed. Therefore, this deteriorates the fast response characteristic of the photodiode. In particular, the moving time of the hole with slow drift velocity controls the fast response characteristic.

The technology disclosed in the specification of the present application aims to obtain a waveguide photodetector having an improved fast response characteristic even when the light input power is large.

Means for Solving Problems

In an example of a waveguide photodetector disclosed in the present specification, a waveguide layer having a core layer for absorbing light is formed on a semiconductor substrate. The waveguide photodetector includes a first contact layer of a first conductivity type, the waveguide layer, and a second contact layer of a second conductivity type that are sequentially formed on the semiconductor substrate. The waveguide layer includes a first cladding layer of the first conductivity type disposed on a side of the first contact layer, a second cladding layer of the second conductivity type disposed on a side of the second contact layer, and the core layer disposed between the first cladding layer and the second cladding layer. The core layer includes a light absorption layer and an impurity-doped light absorption layer that has a higher concentration of a p-type impurity than that of the light absorption layer and is disposed on a side of a light incident face on which signal light is incident.

Effect of Invention

In an example of the waveguide photodetector disclosed in the present specification, since the core layer of the waveguide layer includes the impurity-doped light absorption layer that is disposed on the side of the light incident face and has a higher concentration of p-type impurities than that of the light absorption layer, the fast response characteristic can be improved even when optical input power is large.

MODES FOR CARRYING OUT INVENTION

Embodiment 1

Figure 1:
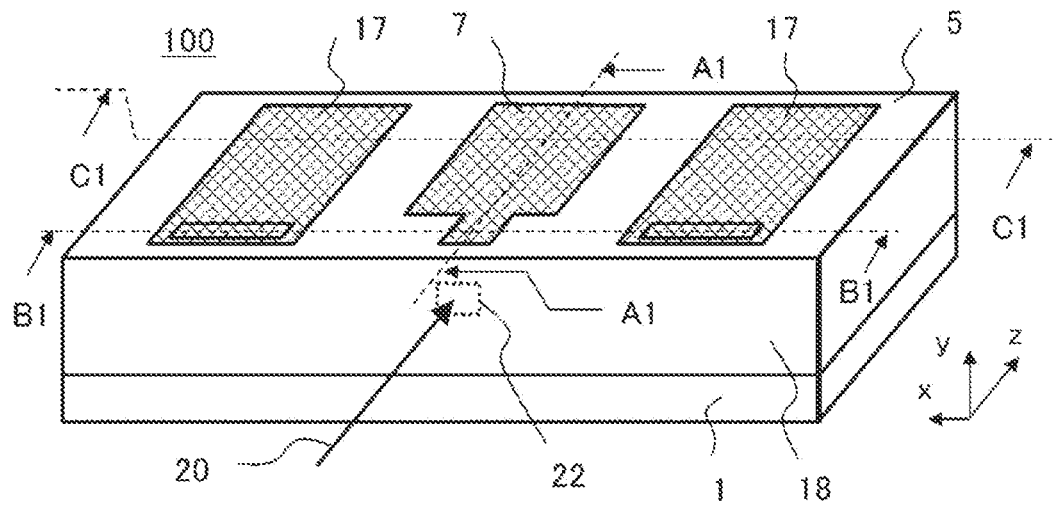
FIG. 1 is a perspective view of a waveguide photodetector in a first example according to Embodiment 1.
Figure 2:
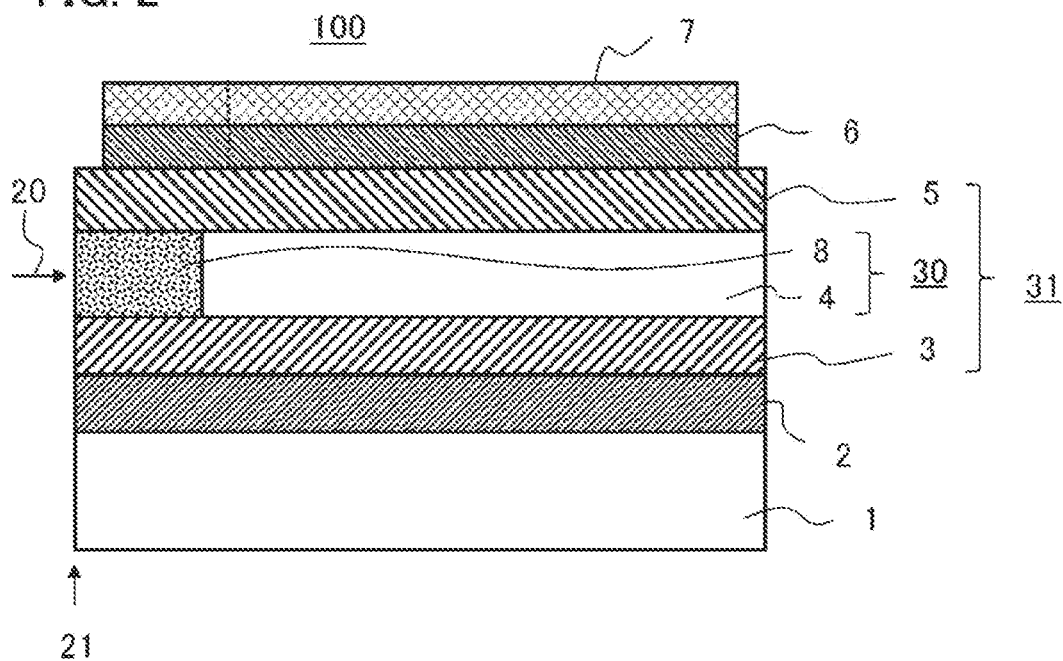
FIG. 2 is a cross-sectional view taken along the broken line A1-A1 in FIG. 1.
Figure 3:
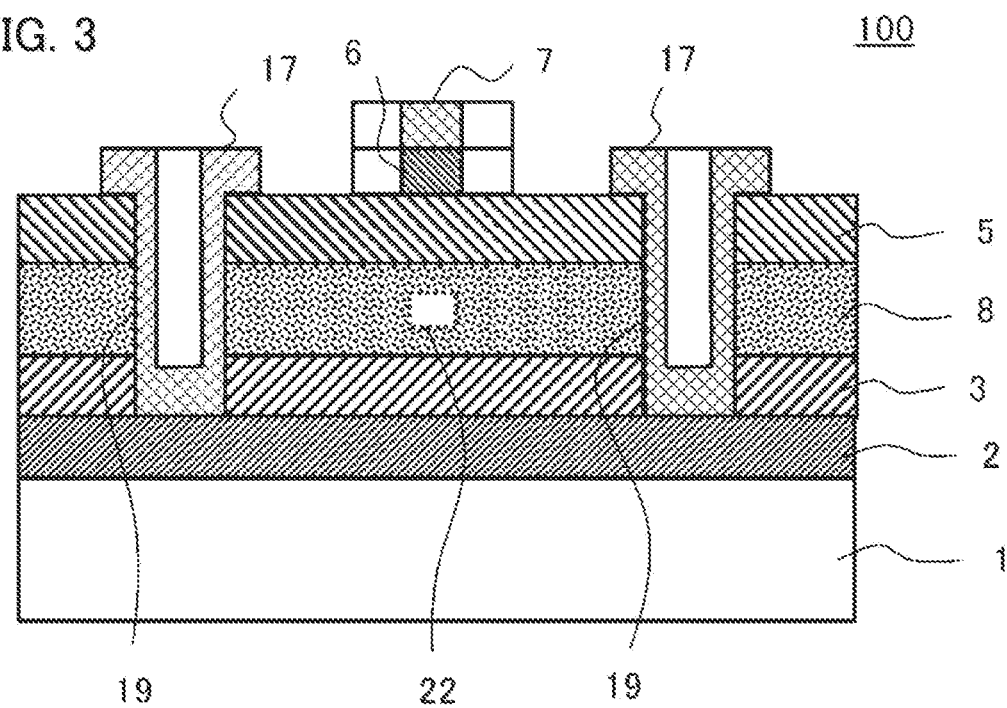
FIG. 3 is a cross-sectional view taken along the broken line B1-B1 in FIG. 1.
Figure 4:
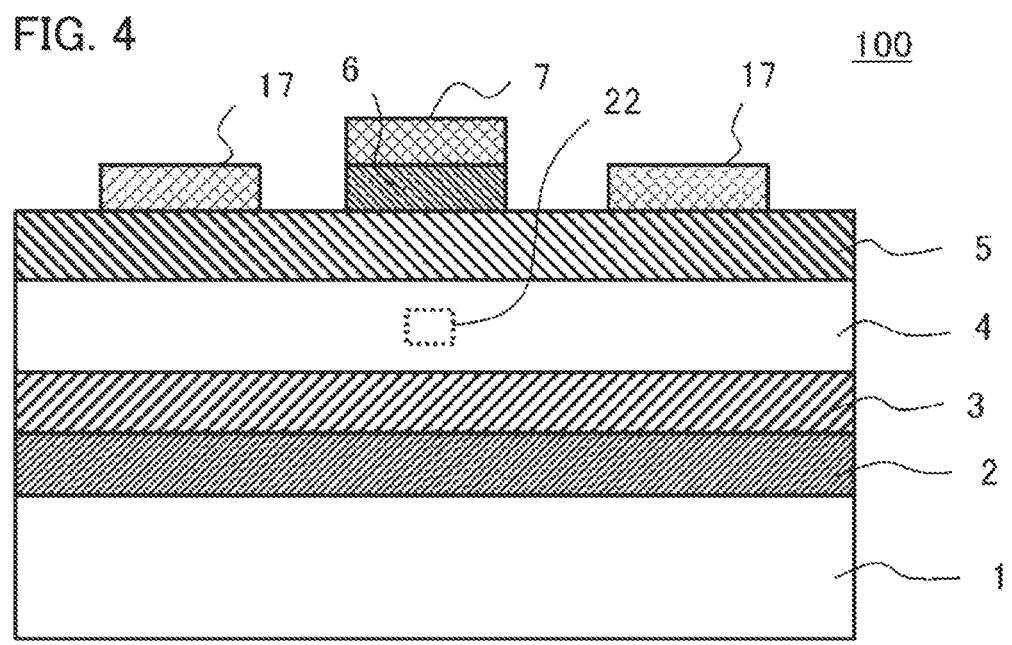
FIG. 4 is a cross-sectional view taken along the broken line C1-C1 in FIG. 1.
Figure 5:
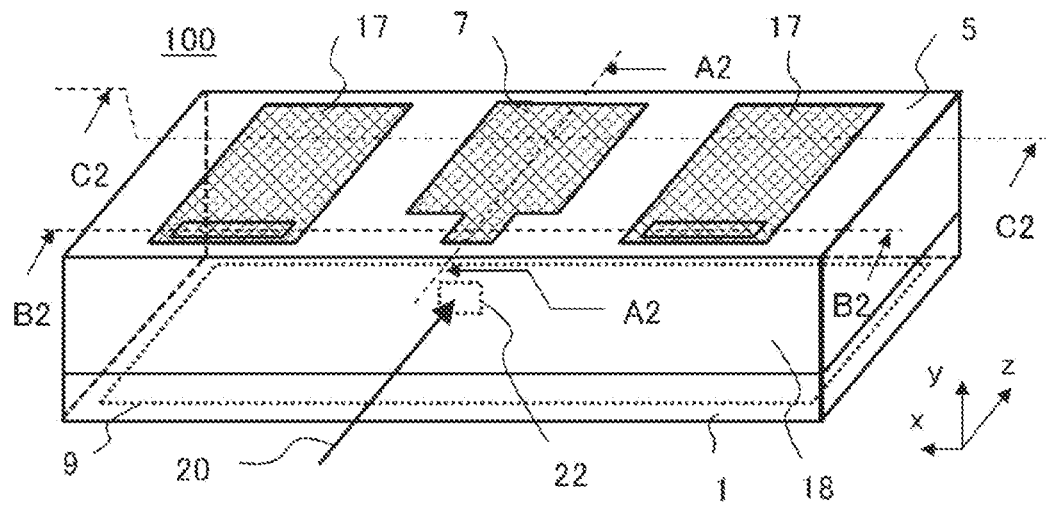
FIG. 5 is a perspective view of a waveguide photodetector in a second example according to Embodiment 1.
Figure 6:
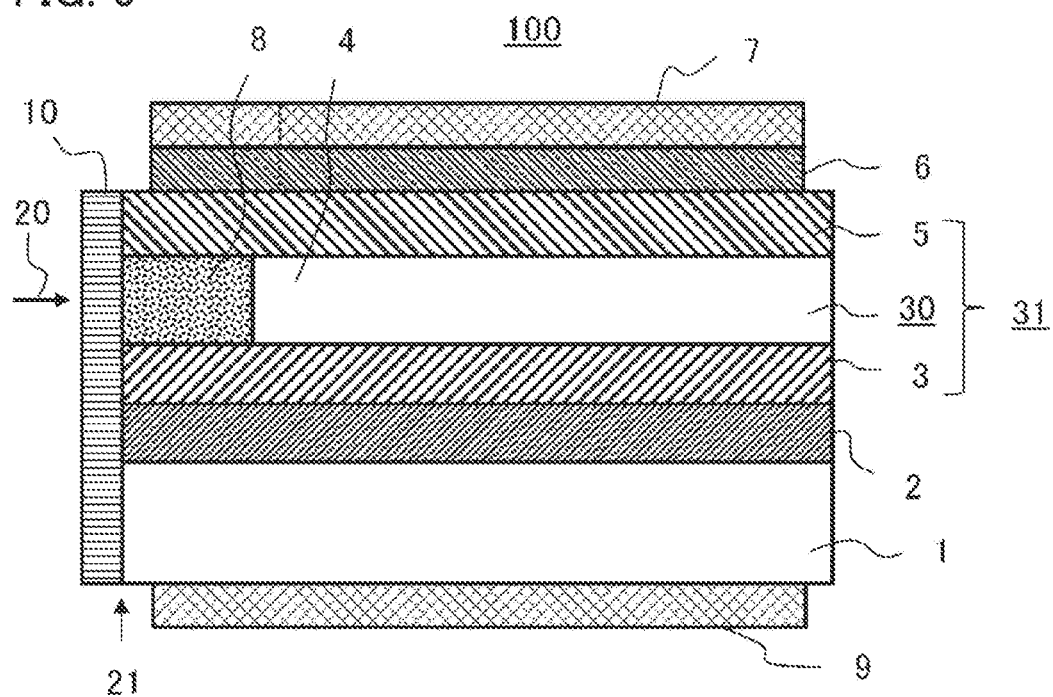
FIG. 6 is a cross-sectional view taken along the broken line A2-A2 in FIG. 5.
Figure 7:
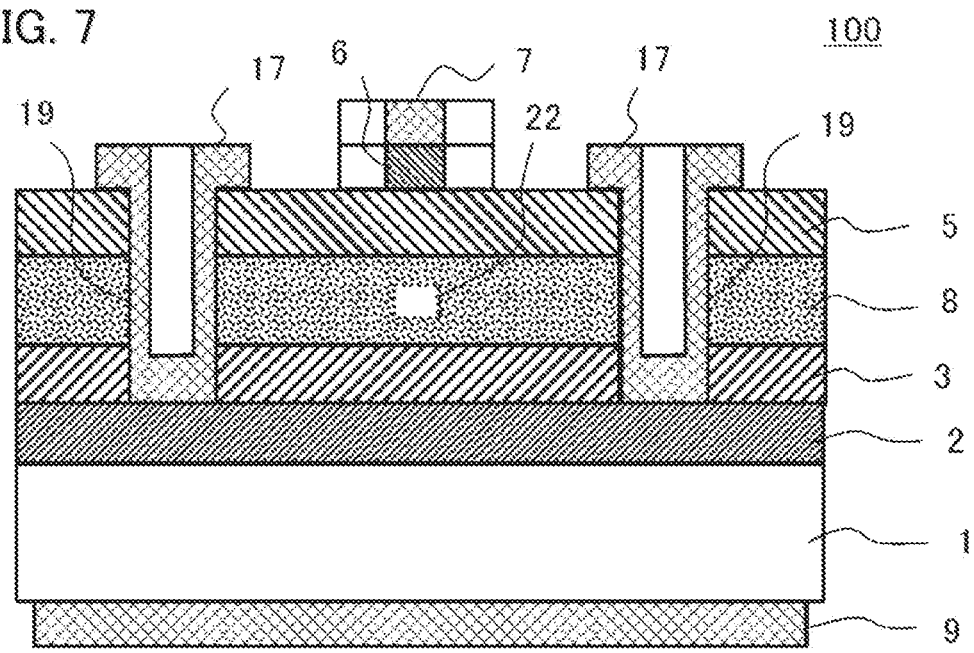
FIG. 7 is a cross-sectional view taken along the broken line B2-B2 in FIG. 5.
Figure 8:
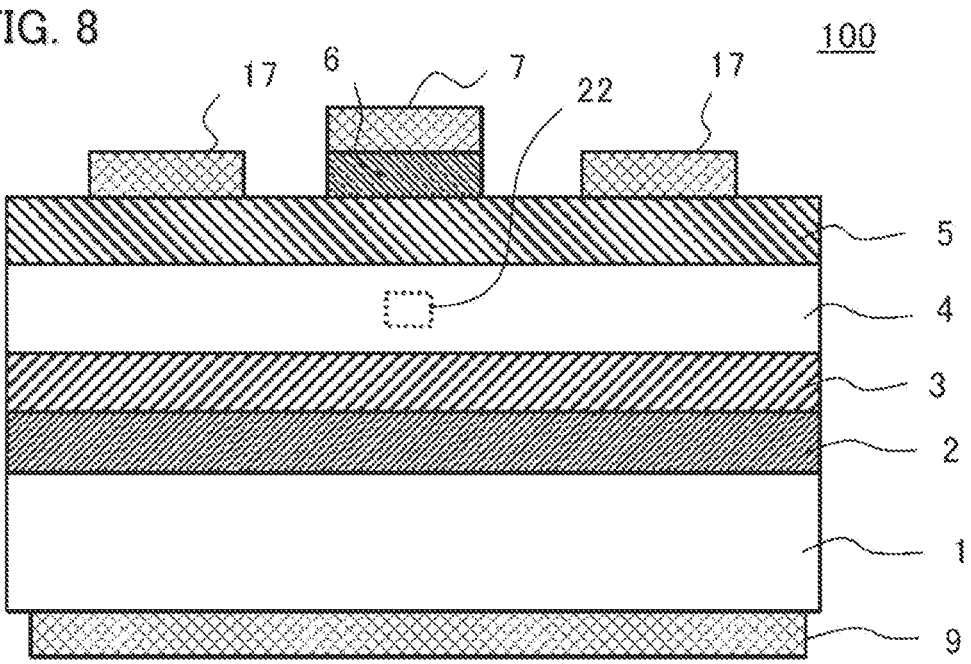
FIG. 8 is a cross-sectional view taken along the broken line C2-C2 in FIG. 5.
Figure 9:
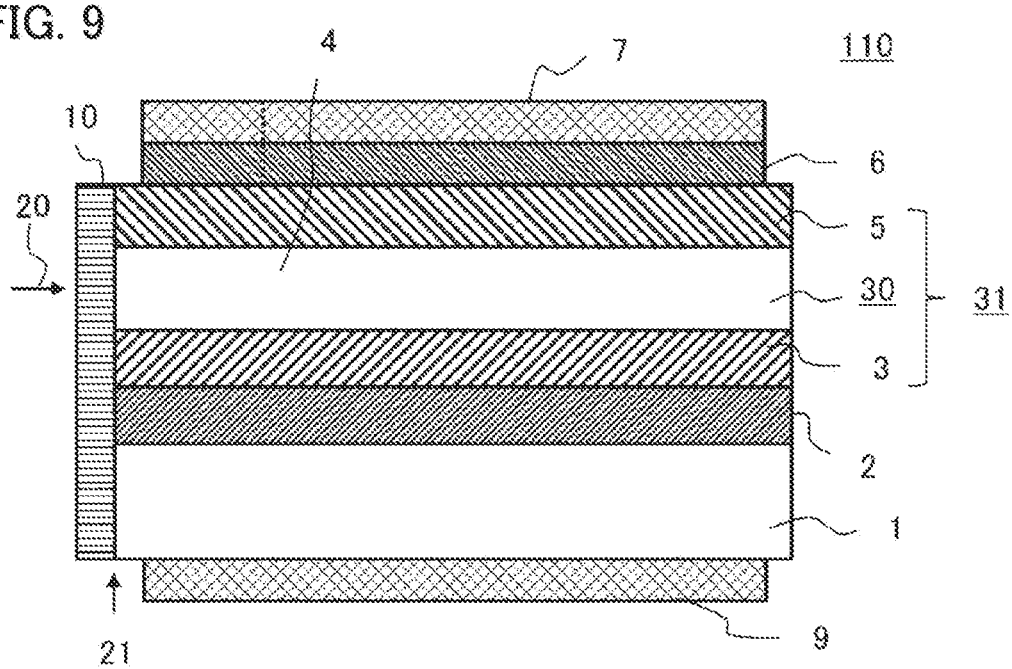
FIG. 9 is a cross-sectional view of a waveguide photodetector according to a comparative example.
Figure 10:
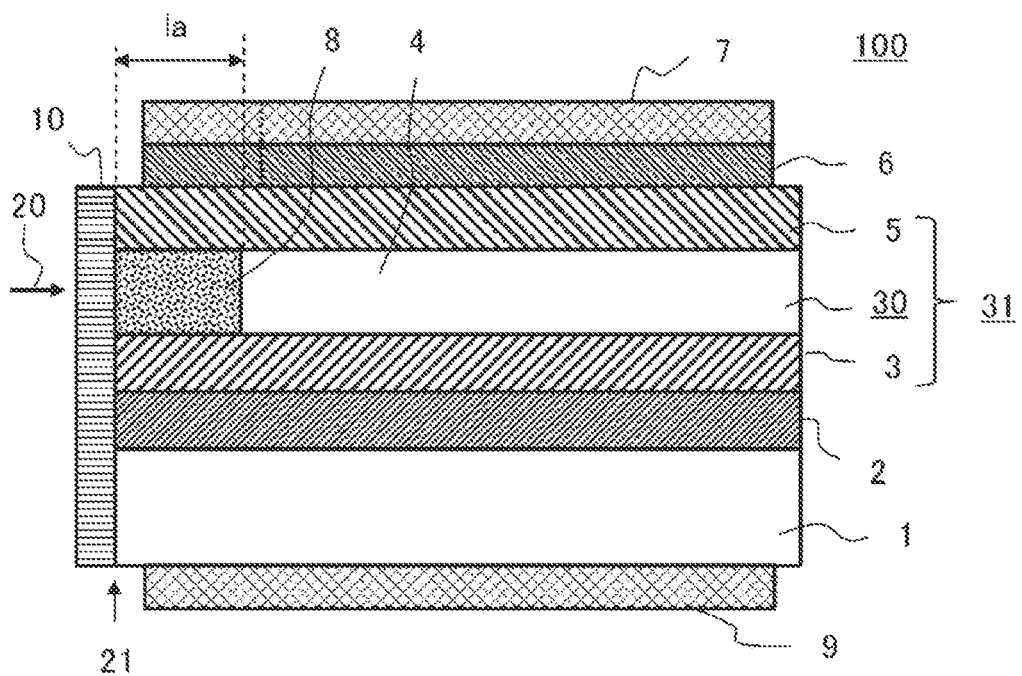
FIG. 10 is a cross-sectional view of a waveguide photodetector in a third example according to Embodiment 1.
Figure 11:
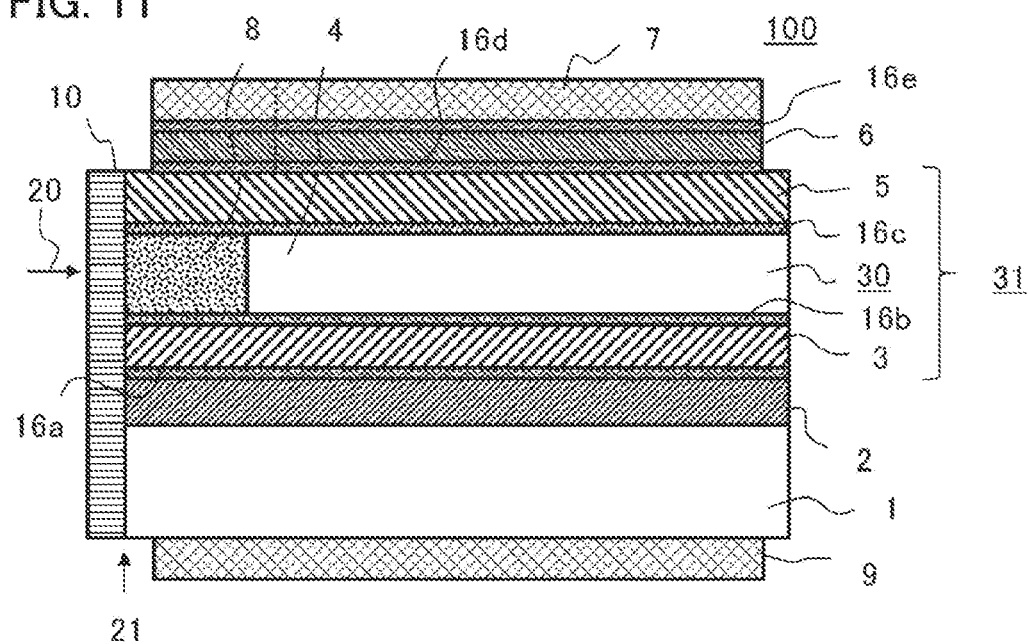
FIG. 11 is a cross-sectional view of a waveguide photodetector in a fourth example according to Embodiment 1.
Figure 12:
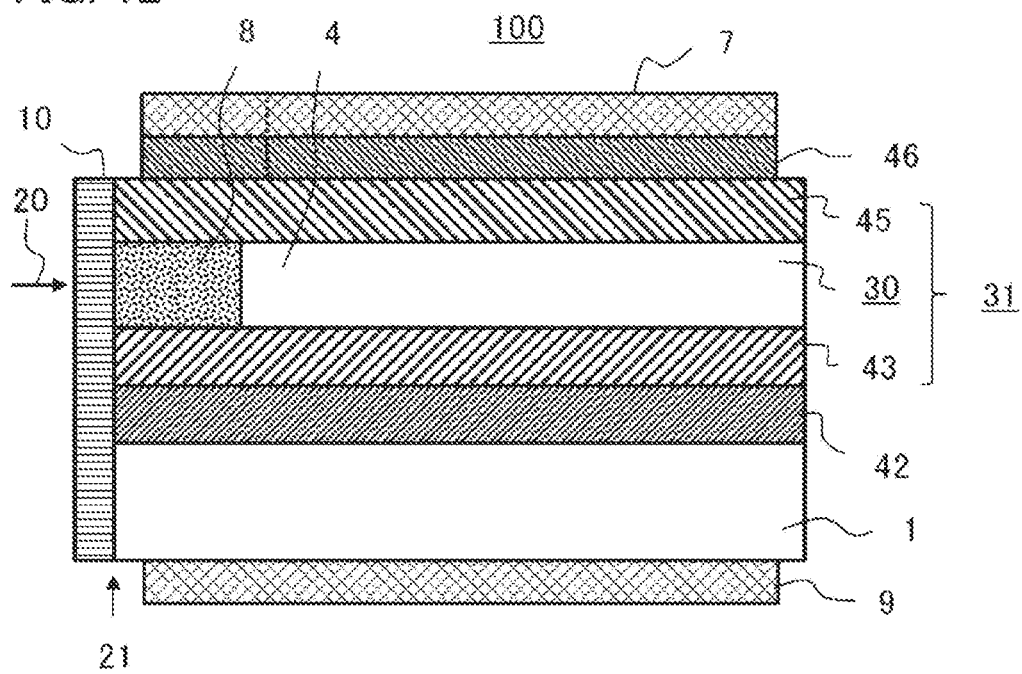
FIG. 12 is a cross-sectional view of a waveguide photodetector in a fifth example according to Embodiment 1.

FIG. 1 is a perspective view of a waveguide photodetector in a first example according to Embodiment 1, and FIG. 2 is a cross-sectional view taken along the broken line A1-A1 in FIG. 1. FIG. 3 is a cross-sectional view taken along the broken line B1-B1 in FIG. 1, and FIG. 4 is a cross-sectional view taken along the broken line C1-C1 in FIG. 1. FIG. 5 is a perspective view of a waveguide photodetector in a second example according to Embodiment 1, and FIG. 6 is a cross-sectional view taken along the broken line A2-A2 in FIG. 5. FIG. 7 is a cross-sectional view taken along the broken line B2-B2 in FIG. 5, and FIG. 8 is a cross-sectional view taken along the broken line C2-C2 in FIG. 5. FIG. 9 is a cross-sectional view of a waveguide photodetector according to a comparative example. FIG. 10 is a cross-sectional view of a waveguide photodetector in a third example according to Embodiment 1, and FIG. 11 is a cross-sectional view of a waveguide photodetector in a fourth example according to Embodiment 1. FIG. 12 is a cross-sectional view of a waveguide photodetector in a fifth example according to Embodiment 1. The waveguide photodetector 100 in a first example according to Embodiment 1 is provided with a semiconductor substrate 1, a stacked structure part 18 formed on the semiconductor substrate 1, a first electrode 17, and a second electrode 7.

The semiconductor substrate 1 is, for example, an InP substrate. As shown in FIG. 2, the stacked structure part 18 has a structure in which a first contact layer 2 of a first conductivity type, a first cladding layer 3 of the first conductivity type, a core layer 30 having a light absorption layer 4 of InGaAs or the like and an impurity-doped light absorption layer 8 thereof doped with a p-type impurity, a second cladding layer 5 of a second conductivity type, and a second contact layer 6 of the second conductivity type are sequentially stacked on the surface of the semiconductor substrate 1. The first cladding layer 3, the core layer 30, and the second cladding layer 5 constitute a waveguide layer 31. Therefore, the stacked structure part 18 includes the first contact layer 2 of the first conductivity type, the waveguide layer 31, and the second contact layer 6 of the second conductivity type, and the waveguide layer 31 includes the first cladding layer 3 of the first conductivity type disposed on the side of the first contact layer 2, the second cladding layer 5 of the second conductivity type disposed on the side of the second contact layer 6, and the core layer 30 disposed between the first cladding layer 3 and the second cladding layer 5. The second electrode 7 is formed on the surface of the second contact layer 6 of the second conductivity type in the stacked structure part 18. For example, the light absorption layer 4 is an undoped layer such as InGaAs doped with no impurities, and the impurity-doped light absorption layer 8 is an impurity-doped layer in which a p-type impurity is doped in a crystal layer such as InGaAs. In addition, the first electrode 17 is connected to the first contact layer 2 of the first conductivity type through a contact hole 19 formed in the stacked structure part 18. For example, the first conductivity type is n-type and the second conductivity type is p-type. The impurity-doped light absorption layer 8 is a light absorption layer in which the light absorption layer 4 on the side of a light incident face 21 on which signal light 20 is incident is p-type doped. The signal light 20 is incident on a light incident part 22 of the core layer 30. FIG. 2 is a cross-sectional view taken along the traveling direction of the signal light 20, namely, the light traveling direction, and FIG. 3 and FIG. 4 are cross-sectional views taken along the direction perpendicular to the traveling direction of the signal light 20.

The traveling direction of the signal light 20 is the z-direction, the direction perpendicular to the semiconductor substrate 1 is the y-direction, and the direction perpendicular to the z-direction and the y-direction is the x-direction. The cross section shown in FIG. 2 can also be referred to as a cross section cut in the Y-Z plane including the y-direction axis and the z-direction axis. The cross sections shown in FIG. 3 and FIG. 4 can also be referred to as cross sections cut in the X-Y plane including the x-direction axis and the y-direction axis.

A method for manufacturing the waveguide photodetector 100 according to Embodiment 1 will be described. A liquid phase epitaxy (LPE), a vapor phase epitaxy (VPE), a metal organic vapor phase epitaxy (MO-VPE), a molecular beam epitaxy (MBE), and the like are used as a crystal growth method for each layer of the stacked structure part 18.

Each layer of the stacked structure part 18 is a group III-V semiconductor crystal. Specific examples of each layer of the stacked structure part 18 will be described later. In order to provide conductivity to the group III-V semiconductor crystal, a group II atom such as Be, Mg, Zn, or Cd is used as a p-type dopant (p-type impurity), and a group VI atom such as S, Se, or Te is used as an n-type dopant (n-type impurity). In addition, group IV atoms such as C, Si, Ge, and Sn are used as amphoteric impurities that function as either p-type or n-type conductive dopants depending on a semiconductor crystal. In addition, atoms such as Fe and Ru function as insulating dopants that suppress conductivity and are semi-insulating (SI) types.

The impurity-doped light absorption layer 8 is formed by diffusing or implanting a p-type dopant into part of the light absorption layer 4 of the stacked structure part 18, for example, on the side of the light incident face 21. An insulating film or a photoresist mask is formed by a typical lithography technique on the surface of the stacked structure part 18 before the formation of the impurity-doped light absorption layer 8, that is, on the surface opposite to the semiconductor substrate 1, and a p-type dopant is diffused or implanted with the portion of the mask corresponding to the impurity-doped light absorption layer 8 to be formed opened. In this way, the core layer 30 in which part of the light absorption layer 4 that is p-type doped is formed. Although an example is described in which the light absorption layer 4 is an undoped layer and the impurity-doped light absorption layer 8 is a doped layer, the light absorption layer 4 is not limited to the undoped layer. The light absorption layer 4 needs to have a p-type impurity concentration lower than that of the impurity-doped light absorption layer 8. Specifically, the concentration of the p-type impurity or the n-type impurity in the light absorption layer 4 needs to be 1/10 or less of the concentration of the p-type impurity in the impurity-doped light absorption layer 8. Therefore, the core layer 30 has the light absorption layer 4 and the impurity-doped light absorption layer 8 that has a higher concentration of the p-type impurity than that of the light absorption layer 4 and is disposed on the side of the light incident face 21 on which the signal light 20 is incident.

The first electrode 17 and the second electrode 7 are formed as follows. The contact hole 19 is formed by wet etching in the stacked structure part 18 with only a desired portion of the mask opened using a typical lithography technique. With a mask opened only in desired portions using a typical lithography technique at portions where the first electrode 17 and the second electrode 7 are to be formed, a metal such as Ti, Pt or Au is deposited by a method such as electron beam evaporation or sputtering.

Thereafter, unnecessary portions of the metal are removed to form the first electrode 17 and the second electrode 7. Alternatively, the first electrode 17 and the second electrode 7 may be formed in the following manner. The metal such as Ti, Pt, or Au is deposited on the entire surface of the stacked structure part 18 in which the contact holes 19 are formed. Thereafter, the first electrode 17 and the second electrode 7 are formed by wet etching of an unnecessary portion of the metal with only the desired portions left as a mask using a typical lithography technique.

The semiconductor substrate 1 is preferably a semi-insulating substrate doped with Fe or the like. The first contact layer 2 may be an epitaxial layer of any one of InGaAs, InP, InGaAsP, AlInAs, and AlGaInAs, or a composite layer in combination of these layers, etc. The first cladding layer 3 is an epitaxial layer of any one of InP, InGaAsP, AlInAs, and AlGaInAs or a composite layer in combination of these layers, etc. The core layer 30, namely, the light absorption layer 4 and the impurity-doped light absorption layer 8, is made of a material in which photo-carriers are generated when light is incident thereon, that is, a material having a small band gap with respect to the incident light. The core layer 30 may be an epitaxial layer of any one of InGaAs, InGaAsP, and InGaAsSb, or a composite layer in combination of these layers, etc. The second cladding layer 5 is an epitaxial layer of any one of InP, InGaAsP, AlInAs, and AlGaInAs or a composite layer in combination of these layers, etc. The second contact layer 6 may be an epitaxial layer of any one of InGaAs, InP, InGaAsP, AlInAs, and AlGaInAs, or a composite layer in combination of these layers, etc.

The cross-sectional view shown in FIG. 3 is a cross-sectional view of a portion where the impurity-doped light absorption layer 8 is formed, and the cross-sectional view shown in FIG. 4 is a cross-sectional view of a portion where the light absorption layer 4 is formed. An example is shown in which the second contact layer 6 and the second electrode 7 formed on an upper portion of the impurity-doped light absorption layer 8, namely, on the positive side in the y-direction, have a length in the x-direction smaller than that of the second contact layer 6 and the second electrode 7 formed on an upper portion of the light absorption layer 4, namely, on the positive side in the y-direction. The length in the x-direction of the second contact layer 6 and the second electrode 7 formed above the impurity-doped light absorption layer 8 needs to be a length that is including the length of the light incident part 22 in the x-direction. Since the length in the x-direction in the second contact layer 6 and the second electrode 7 formed on the upper portion of the light absorption layer 4, namely, the second contact layer 6 and the second electrode 7 at the rear portion away from the light incident face 21, is the length for the portion to be connected by a wire or the like, the length in the x-direction is wider than that of the second contact layer 6 and the second electrode 7 formed on the upper portion of the impurity-doped light absorption layer 8, namely, the second contact layer 6 and the second electrode 7 at a front side on the side of the light incident face 21. An example is shown in which the first electrode 17 has the same length in the x-direction at each position in the z-direction. In FIG. 2, the broken line on the side of the light incident face 21 of the second electrode 7 and the second contact layer 6 indicates a border where the length in the x-direction changes. In FIG. 3, side surfaces of the second electrode 7 and the second contact layer 6 that are on the side apart from the cross sections of the second electrode 7 and the second contact layer 6 in the traveling direction of the signal light 20, namely, on the positive side in the z-direction, are shown in white. Inner surfaces of the first electrode 17 on the side apart from the cross sections of the first electrode 17 in the traveling direction of the signal light 20, namely, on the positive side in the z-direction, is shown in white. Further, the light incident part 22 is shown in white for clarity. In other figures, the light incident part 22 is shown in the same way.

As shown in a waveguide photodetector 100 of a second example in FIG. 5 to FIG. 8, the whole or part of the surface on the back side of the semiconductor substrate 1 may be covered with a back side electrode 9. In addition, at least a portion of the light incident face 21 on which light is incident may be covered with an anti-reflection film 10. In FIG. 5, the anti-reflection film 10 is omitted. FIG. 6 shows an example in which the anti-reflection film 10 is formed from the semiconductor substrate 1 over to each of the layers of the stacked structure part 18. The anti-reflection film 10 is formed by vapor deposition or sputtering with the chip of the waveguide photodetector 100 cleaved. The back side electrode 9 is formed in the same manner as the first electrode 17 and the second electrode 7.

Operation of the waveguide photodetector 100 according to Embodiment 1 will be described in comparison with a waveguide photodetector 110 of a comparative example. The waveguide photodetector 110 of the comparative example shown in FIG. 9 is the same as the waveguide photodetector 100 of the second example except that the core layer 30 is only the light absorption layer 4. The cross section shown in FIG. 9 corresponds to the cross section shown in FIG. 6. An example in which the first conductivity type is the n-type and the second conductivity type is the p-type will be described. In a case where a reverse bias is applied between the first electrode 17 and the second electrode 7, a voltage is applied such that the first electrode 17 has a positive potential and the second electrode 7 has a negative potential. When light is incident on the light incident face 21 of the waveguide photodetector 110 of the comparative example, a large number of photocarriers are generated in a region near the light incident face 21 of the light absorption layer 4. The holes, which are the generated photocarriers, move toward the second cladding layer 5 of the p-type due to a drift caused by the reverse bias applied between the first electrode 17 and the second electrode 7. Electrons, which are generated photocarriers, move toward the first cladding layer 3 of the n-type in the opposite direction. Since the effective mass of the hole is larger than that of the electron and the moving speed is smaller than that of the electron, the fast response characteristic is controlled by the time needed to move for the hole.

When intense light is incident on the light incident face 21, the photocarrier generated on the side of the light incident face 21 in the light absorption layer 4 also increases. Since the movement of the holes is slow, the holes stay on the side of the light incident face 21 in the light absorption layer 4 and the second cladding layer 5. This holes that stay act for canceling the electric field due to the voltage applied between the first electrode 17 and the second electrode 7, that is, the electric field between the first contact layer 2 of the n-type and the second contact layer 6 of the p-type, so that the movement of the hole is further slowed down. Therefore, the holes that stay further increases, and as a result, the fast response characteristic of the waveguide photodetector 110 of the comparative example is deteriorated. Further, in the waveguide photodetector 110 of the comparative example, the output current suitable for the optical input power does not flow, and the linearity of the output also deteriorates.

In contrast, in the waveguide photodetector 100 according to Embodiment 1, the holes as photocarriers are mainly generated in the region of the p-type impurity-doped light absorption layer 8. Since the generated holes are majority carriers in the p-type region, namely, the region of the impurity-doped light absorption layer 8, they aren't the factor that determine the response speed. In the waveguide photodetector 100 of Embodiment 1, the response speed is determined by the drift phenomenon of the electrons in the p-type region. Since the drift velocity of electrons is larger than that of holes, the response speed of the waveguide photodetector 100 of Embodiment 1 is higher than that of the waveguide photodetector 110 of the comparative example. Therefore, unlike the waveguide photodetector 110 of the comparative example, the waveguide photodetector 100 of Embodiment 1 can improve fast response characteristic even when the optical input power is large. Further, in the waveguide photodetector 100 of Embodiment 1, the length in the y-direction of a depletion layer formed on the side of the light incident face 21 in the impurity-doped light absorption layer 8 is shorter than the depletion layer of the waveguide photodetector 110 of the comparative example, and the holes are rapidly moved to the second cladding layer 5 so that the holes is not accumulated in the depletion layer, whereby the space charge effect can be suppressed. Therefore, the waveguide photodetector 100 of Embodiment 1 can improve the fast response characteristic better than the waveguide photodetector 110 of the comparative example and can improve the linearity of the photocurrent for the optical input power.

Note that, when the light absorption layers 4 are all made of the impurity-doped light absorption layer 8, the length of the depletion layer in the y-direction is shortened because there is no undoped layer region or no region where the concentration of impurities is lower than that of the impurity-doped light absorption layer 8, thereby increasing the capacitance of the waveguide photodetector and deteriorating the fast response characteristic. Therefore, it is desirable that only the region on the side of the light incident face 21 in the core layer 30 be the impurity-doped light absorption layer 8.

An example of the length of the impurity-doped light absorption layer 8 in the z-direction will be described. In the waveguide photodetector 100 of a third example shown in FIG. 10, the length of the impurity-doped light absorption layer 8 in the z-direction is $1a$. The cross section shown in FIG. 10 corresponds to the cross section shown in FIG. 6. Typically, a length of the light absorption layer 4 of a waveguide photodetector, that is, the length of the light absorption layer 4 of the waveguide photodetector 110 of the comparative example is set to about several tens of micrometers in many cases. By setting the length $1a$ of the p-type impurity-doped light absorption layer 8 to about 3 μm out of the length of the light absorption layer 4 of about several 10 μm, 90% or more of the incident light can be absorbed in the p-type impurity-doped light absorption layer 8. By setting the length $1a$ of the p-type impurity-doped light absorption layer 8 to about 3 μm, the waveguide photodetector 100 according to Embodiment 1 can improve the fast response characteristic and the linearity of the photocurrent even when the optical input power is large, while reducing the influence of the capacitance increase due to the length $1a$ of the p-type impurity-doped light absorption layer 8. The length $1a$ is preferably 2 to 3 μm, for example.

Note that, as shown in a waveguide photodetector 100 of a fourth example in FIG. 11, band discontinuity relaxation layers 16a, 16b, 16c. 16d, and 16e using InGaAsP, AlGaInAs or the like may be formed between the epitaxial layers of the stacked structure part 18 and between the second electrode 7 and the second contact layer 6 in order to relax band discontinuity. The cross section shown in FIG. 11 corresponds to the cross section shown in FIG. 6. FIG. 11 shows an example in which the band discontinuity relaxation layers 16a, 16b, 16c, 16d, and 16e are formed between the epitaxial layers of the stacked structure part 18 and between the second electrode 7 and the second contact layer 6. The first cladding layer 3, the band discontinuity relaxation layer 16b, the core layer 30, the band discontinuity relaxation layer 16c, and the second cladding layer 5 constitute the waveguide layer 31. Any material may be used for each layer of the stacked structure part 18 as long as the characteristics necessary for the operation of the waveguide photodetector can be obtained, and the above-described materials do not limit the scope.

An example in which the first conductivity type is the n-type and the second conductivity type is the p-type has been described so far, but this is not a limitation. The first conductivity type may be the p-type, and the second conductivity type may be the n-type. As shown in a waveguide photodetector 100 of a fifth example in FIG. 12, the stacked structure part 18 may have a structure in which a first contact layer 42 of the first conductivity type that is the p-type, a first cladding layer 43 of the first conductivity type that is the p-type, the core layer 30 having the light absorption layer 4 of InGaAs and the impurity-doped light absorption layer 8 thereof doped with the p-type impurity, a second cladding layer 45 of the second conductivity type that is the n-type, and a second contact layer 46 of the second conductivity type that is the n-type are stacked in order. The first cladding layer 43, the core layer 30 and the second cladding layer 45 constitute the waveguide layer 31. The cross section shown in FIG. 12 corresponds to the cross section shown in FIG. 6. In a case where a reverse bias is applied between the first electrode 17 and the second electrode 7, a voltage is applied such that the first electrode 17 has a negative potential and the second electrode 7 has a positive potential. Due to the reverse bias applied between the first electrode 17 and the second electrode 7, the holes among the generated photocarriers move toward the first electrode 17 and the first contact layer 42 at the negative potential, and the electrons among the generated photocarriers move toward the second electrode 7 and the second conductivity type second contact layer 46 at the positive potential. Even in this case, the holes do not stay in the impurity-doped light absorption layer 8 doped with the p-type impurity.

Therefore, the waveguide photodetector 100 of the fifth example can improve the fast response characteristic even when the optical input power is large and can improve the linearity of the photocurrent for the optical input power.

Note that, although in the waveguide photodetector devised to reduce surface recombination by forming a window structure at an end face portion on which light is incident as in Patent Document 1, not only the light absorption layer 4 but also all epitaxial layers such as the first cladding layer 3 of the n-type are assigned to the window structure, it is not disclosed that the low speed operation is suppressed to make the operation of the detector at a high speed when the light input power is large. From the window structure shown in Patent Document 1, it is impossible to derive the effect obtained by the waveguide photodetector 100 according to Embodiment 1.

As described above, the waveguide photodetector 100 of Embodiment 1 is a waveguide photodetector in which the waveguide layer having the core layer for absorbing light is formed on the semiconductor substrate. The waveguide photodetector 100 includes the first contact layer 2 of the first conductivity type, the waveguide layer 31, and the second contact layer 6 of the second conductivity type, which are sequentially formed on the semiconductor substrate 1. The waveguide layer 31 includes the first cladding layer 3 of the first conductivity type disposed on the side of the first contact layer 2, the second cladding layer 5 of the second conductivity type disposed on the side of the second contact layer 6, and the core layer 30 disposed between the first cladding layer 3 and the second cladding layer 5. The core layer 30 includes the light absorption layer 4 and the impurity-doped light absorption layer 8 that has a higher concentration of the p-type impurity than that of the light absorption layer 4 and is disposed on the side of the light incident face 21 on which the signal light 20 is incident. In the waveguide photodetector 100 according to Embodiment 1 with the configuration above, since the core layer 30 of the waveguide layer 31 includes the impurity-doped light absorption layer 8 that is disposed on the side of the light incident face 21 and has a higher concentration of the p-type impurity than that of the light absorption layer 4, the fast response characteristic can be improved even when the light input power is large.

Embodiment 2

Figure 13:
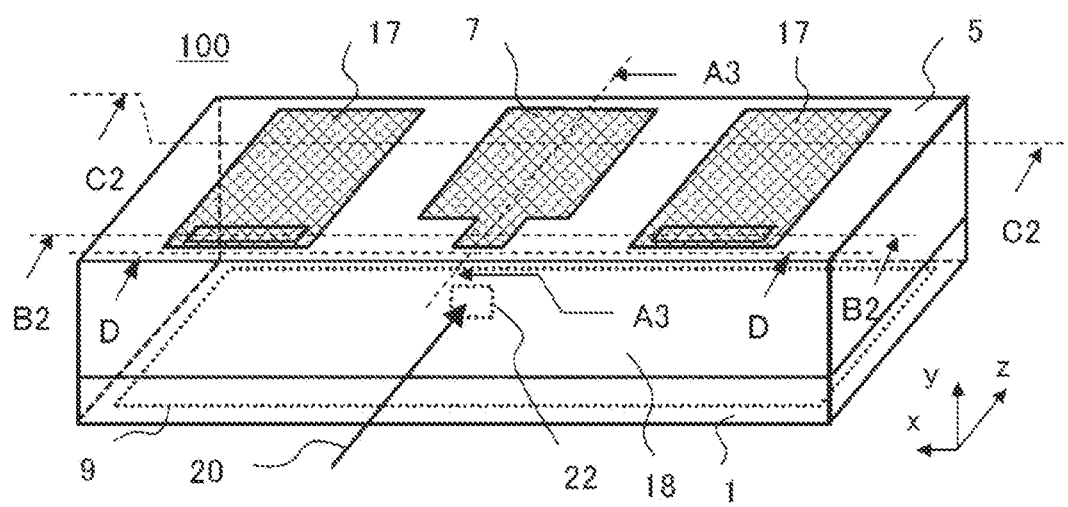
FIG. 13 is a perspective view of a waveguide photodetector in a first example according to Embodiment 2.
Figure 14:
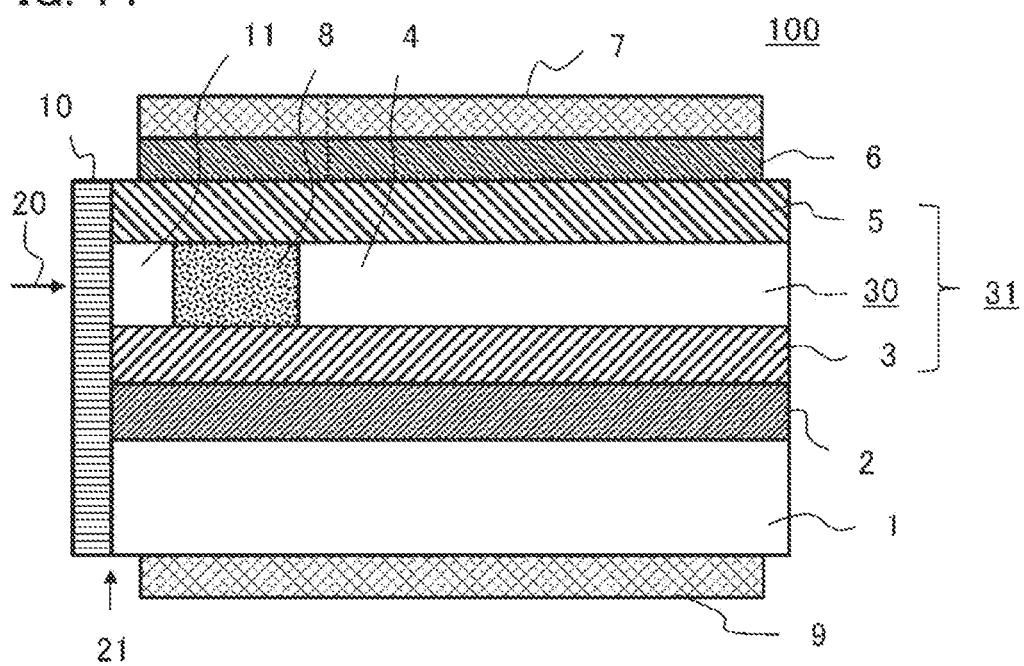
FIG. 14 is a cross-sectional view taken along the broken line A3-A3 in FIG. 13.
Figure 15:
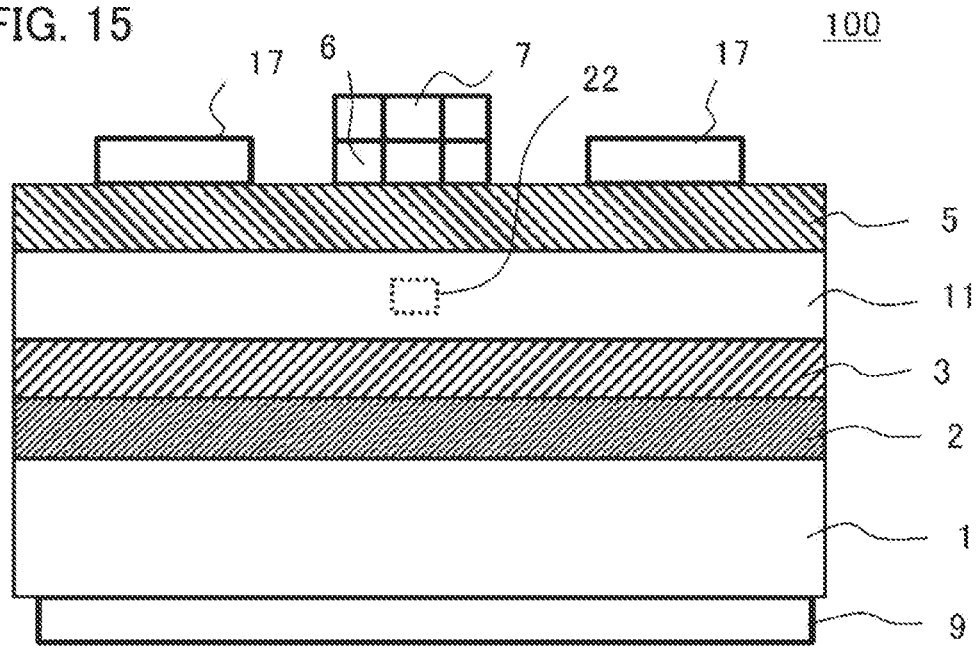
FIG. 15 is a cross-sectional view taken along the broken line D-D in FIG. 13.
Figure 16:
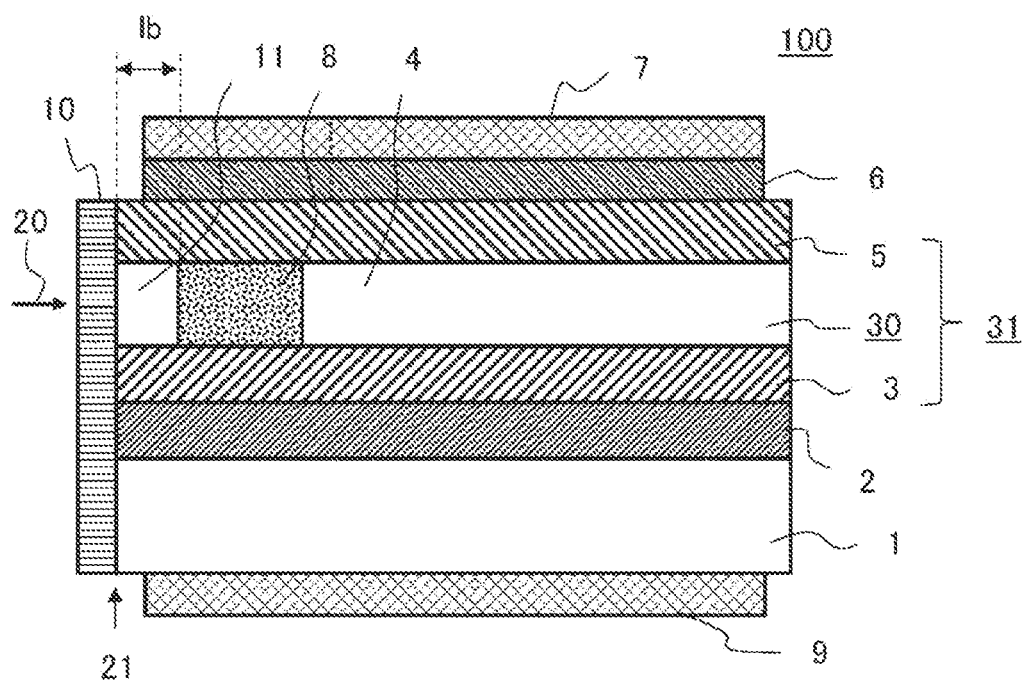
FIG. 16 is a cross-sectional view of a waveguide photodetector in a second example according to Embodiment 2.

FIG. 13 is a perspective view of a waveguide photodetector in a first example according to Embodiment 2. FIG. 14 is a cross-sectional view taken along the broken line A3-A3 in FIG. 13, and FIG. 15 is a cross-sectional view taken along the broken line D-D in FIG. 13. FIG. 16 is a cross-sectional view of a waveguide photodetector in a second example according to Embodiment 2. The cross-sectional views taken along the broken lines B2-B2 and C2-C2 in FIG. 13 are the same as those shown in FIG. 7 and FIG. 8, respectively. The waveguide photodetector 100 of Embodiment 2 is different from the waveguide photodetector 100 of Embodiment 1 in that an undoped light absorption layer 11 is disposed between the p-type impurity-doped light absorption layer 8 and the light incident face 21. A part different from the waveguide photodetector 100 of Embodiment 1 will be mainly described.

In the waveguide photodetector 100 according to Embodiment 2, the core layer 30 includes the undoped light absorption layer 11, the impurity-doped light absorption layer 8, and the light absorption layer 4. The undoped light absorption layer 11 is a light absorption layer that absorbs light in an undoped state and is disposed closer to the light incident face 21 than the impurity-doped light absorption layer 8. In the waveguide photodetector 100 according to Embodiment 1, an electric field tends to concentrate at a portion of an interface on the side of the light incident face 21 between the p-type impurity-doped light absorption layer 8 and the first cladding layer 3 of the n-type or the second cladding layer 5 of the n-type, so that the portion may be structurally weak when intense light is incident. In the case where the first conductivity type is the n-type and the second conductivity type is the p-type, the first cladding layer 3 is the n-type. In the case where the first conductivity type is the p-type and the second conductivity type is the n-type, the second cladding layer 5 is the n-type. In the description, referring to each of the layers shown in FIG. 12 as an example in which the first conductivity type is the p-type and the second conductivity type is the n-type, the second cladding layer 45 of the n-type corresponds to the second cladding layer 5 of the n-type. In the waveguide photodetector 100 according to Embodiment 2, since the portion where the electric field is concentrated is not formed in the region on the side of the light incident face 21, which is an end portion of the detector, the effect of the waveguide photodetector 100 according to Embodiment 1 can be achieved even when more intense light is incident.

An example of a length of the undoped light absorption layer 11 in the z-direction will be described. In the waveguide photodetector 100 in a second example according to Embodiment 2 shown in FIG. 16, the length of the undoped light absorption layer 11 in the z-direction is 1b. The cross section shown in FIG. 16 corresponds to the cross section shown in FIG. 14. For example, when the length 1b in the z-direction of the undoped light absorption layer 11 is set to 50 nm, only 3% or less of the incident light is absorbed therein. Therefore, in the waveguide photodetector 100 in a second example according to Embodiment 2, even if intense light is incident, most of the light can be absorbed by the p-type impurity-doped light absorption layer 8 while the structural strength is maintained, and the fast response characteristic and the linearity of the photocurrent can be improved even when the optical input power is large. The length 1b is preferably from 10 to 50 nm, for example.

Embodiment 3

Figure 17:
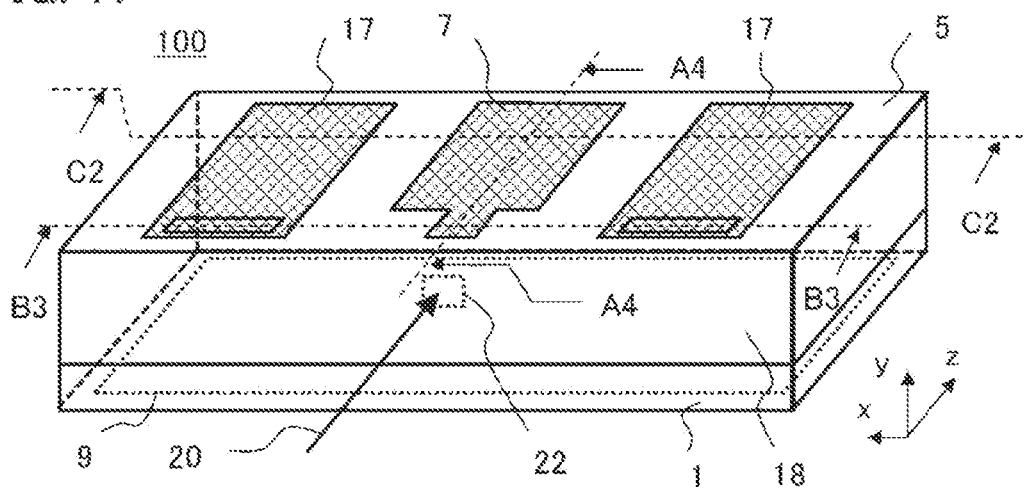
FIG. 17 is a perspective view of a waveguide photodetector according to Embodiment 3.
Figure 18:
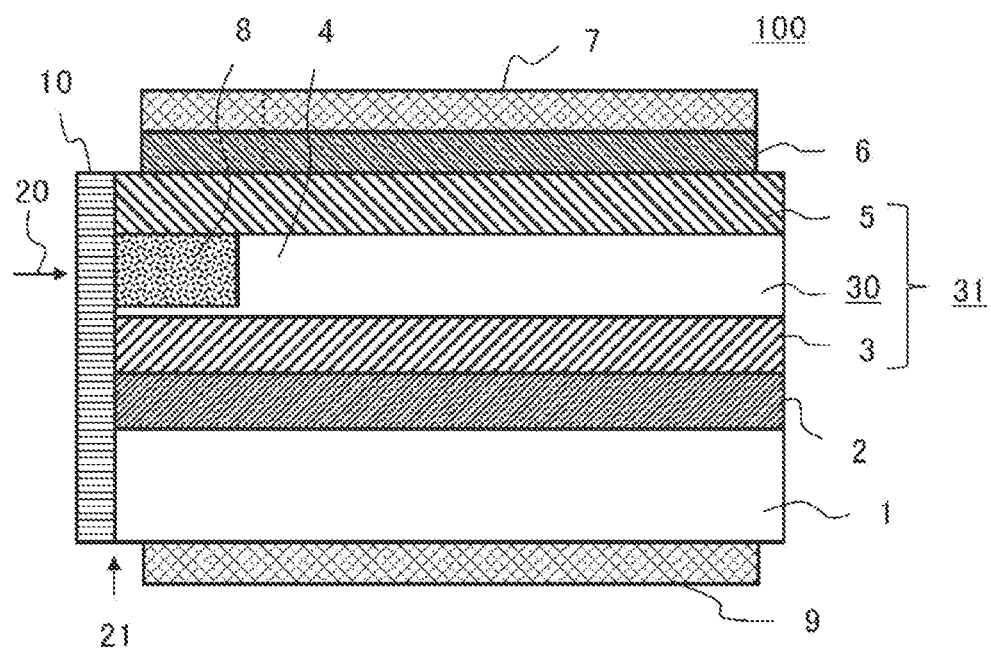
FIG. 18 is a cross-sectional view of a first example taken along the broken line A4-A4 in FIG. 17.
Figure 19:
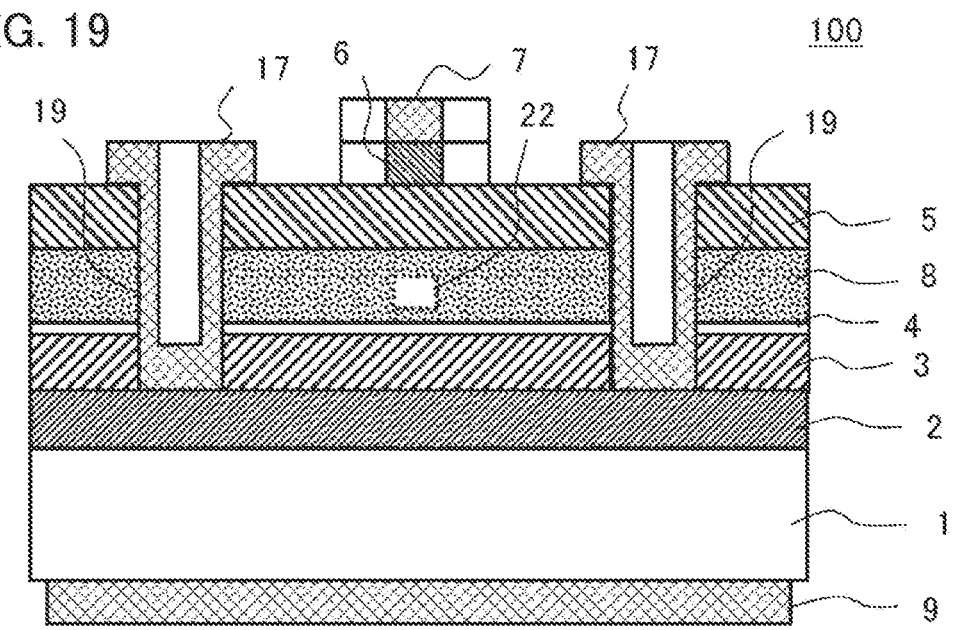
FIG. 19 is a cross-sectional view of a first example taken along the broken line B3-B3 in FIG. 17.
Figure 20:
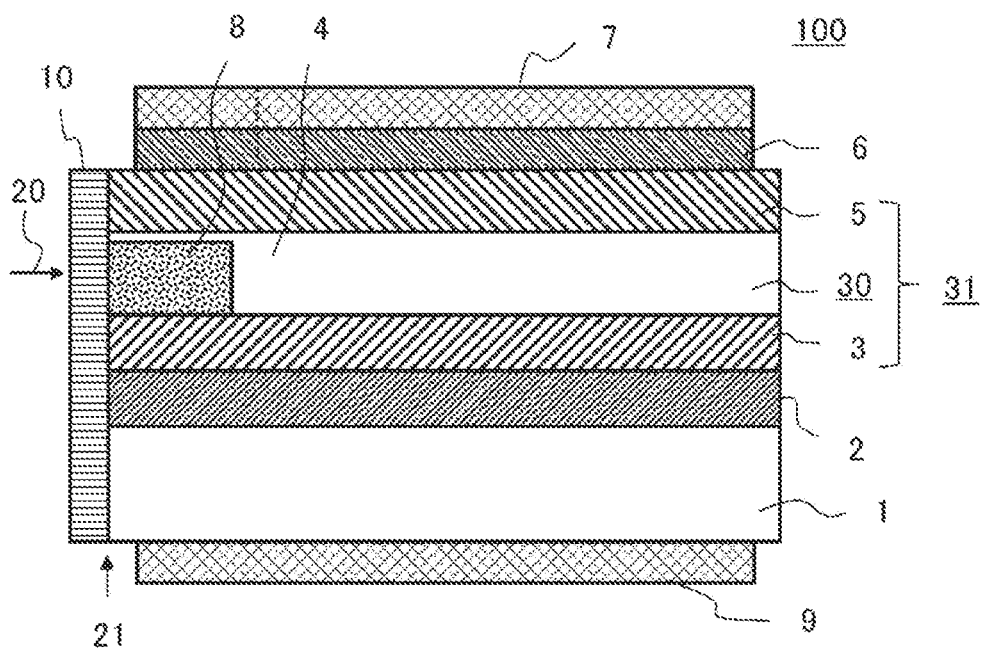
FIG. 20 is a cross-sectional view of a second example taken along the broken line A4-A4 in FIG. 17.
Figure 21:
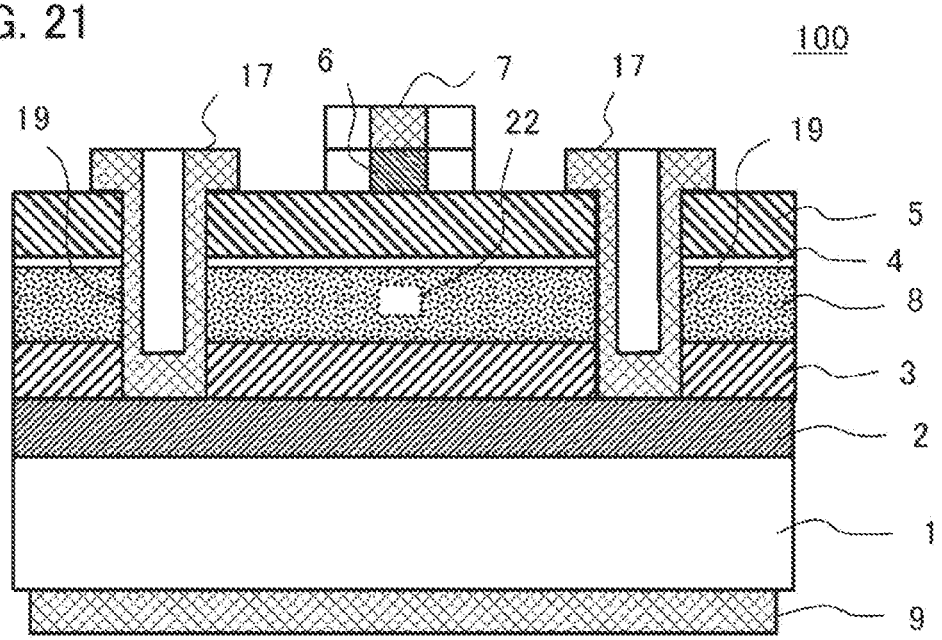
FIG. 21 is a cross-sectional view of a second example taken along the broken line B3-B3 in FIG. 17.

FIG. 17 is a perspective view of a waveguide photodetector according to Embodiment 3. FIG. 18 is a cross-sectional view of a first example taken along the broken line A4-A4 in FIG. 17, and FIG. 19 is a cross-sectional view of the first example taken along the broken line B3-B3 in FIG. 17. FIG. 20 is a cross-sectional view of a second example taken along the broken line A4-A4 in FIG. 17, and FIG. 21 is a cross-sectional view of the second example taken along the broken line B3-B3 in FIG. 17. The cross-sectional view taken along the broken line C2-C2 in FIG. 17 is the same as that in FIG. 8. The waveguide photodetector 100 according to Embodiment 3 differs from the waveguide photodetector 100 according to Embodiment 1 in that the light absorption layer 4 is formed between the p-type impurity-doped light absorption layer 8 and the first cladding layer 3 of the n-type or the second cladding layer 5 of the n-type. A part different from the waveguide photodetector 100 of Embodiment 1 will be mainly described.

In the case where the first conductivity type is the n-type and the second conductivity type is the p-type, the first cladding layer 3 is the n-type. In the case above, the waveguide photodetector 100 in the first example according to Embodiment 3 is configured as shown in FIG. 18 and FIG. 19. In the case where the first conductivity type is the p-type and the second conductivity type is the n-type, the second cladding layer 5 is the n-type. In the case above, the waveguide photodetector 100 in the second example according to Embodiment 3 is configured as shown in FIG. 20 and FIG. 21. In the description, referring to each of the layers shown in FIG. 12 as an example in which the first conductivity type is the p-type and the second conductivity type is the n-type, the second cladding layer 45 of the n-type corresponds to the second cladding layer 5 of the n-type.

The light absorption layer 4 between the p-type impurity-doped light absorption layer 8 and the first cladding layer 3 of the n-type can be implemented by adjusting diffusion or implantation conditions of the p-type dopant in forming the p-type impurity-doped light absorption layer 8. The light absorption layer 4 between the p-type impurity-doped light absorption layer 8 and the second cladding layer 5 of the n-type can be implemented by adjusting implantation conditions of the p-type dopant in forming the p-type impurity-doped light absorption layer 8.

The waveguide photodetector 100 according to Embodiment 3 exhibits the effect of the waveguide photodetector 100 according to Embodiment 1, and the region in the light absorption layer 4 that is undoped or in the light absorption layer 4 with the impurity concentration lower than that of the impurity-doped light absorption layer 8 is wider than that of the waveguide photodetector 100 according to Embodiment 1, so that the capacitance can be reduced, and thus the fast response characteristic can be improved. Note that the light density of the incident signal light 20 is highest at the center of the core layer 30 in the stacking direction of the epitaxial layers, namely, the center in the y-direction, and is lower at a portion that comes closer to the upper and lower portions of the core layer 30, that is, the second cladding layer 5 and the first cladding layer 3. Therefore, the number of photo-carriers generated in a region on the side of the light incident face 21 where the light absorption layer 4 remains is small. Therefore, the characteristics equivalent to those of the waveguide photodetector 100 according to Embodiment 1 can be achieved, and fast response characteristic and the linearity of photocurrent can be improved even when the optical input power is large.

Embodiment 4

Figure 22:
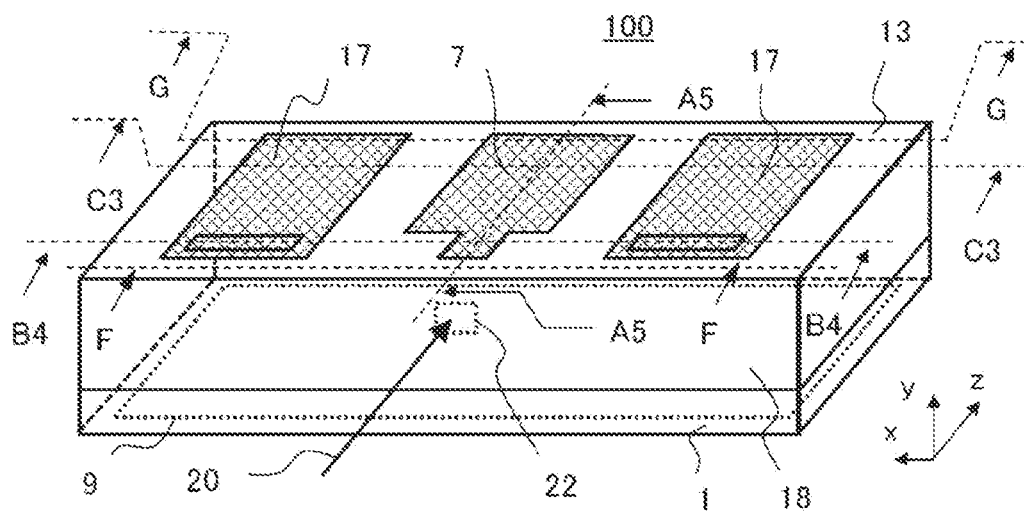
FIG. 22 is a perspective view of a waveguide photodetector according to Embodiment 4.
Figure 23:
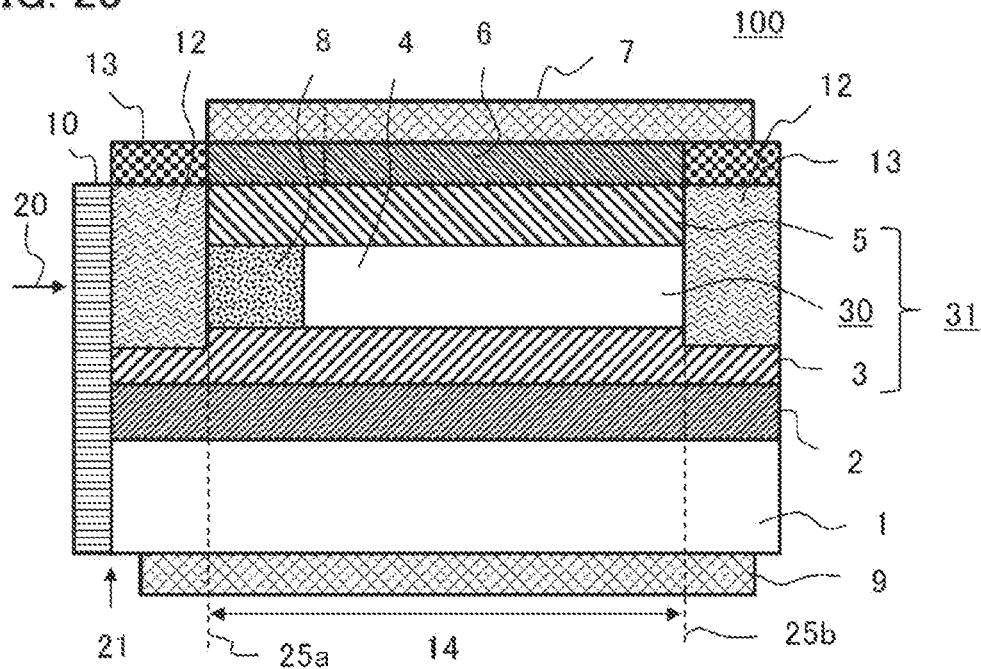
FIG. 23 is a cross-sectional view taken along the broken line A5-A5 in FIG. 22.
Figure 24:
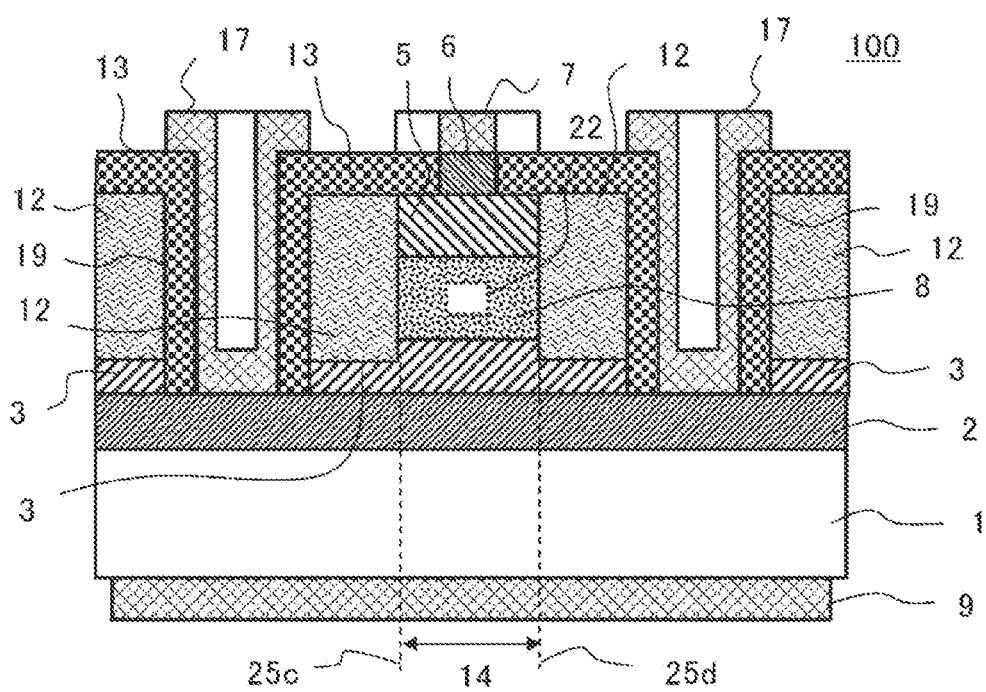
FIG. 24 is a cross-sectional view taken along the broken line B4-B4 in FIG. 22.
Figure 25:
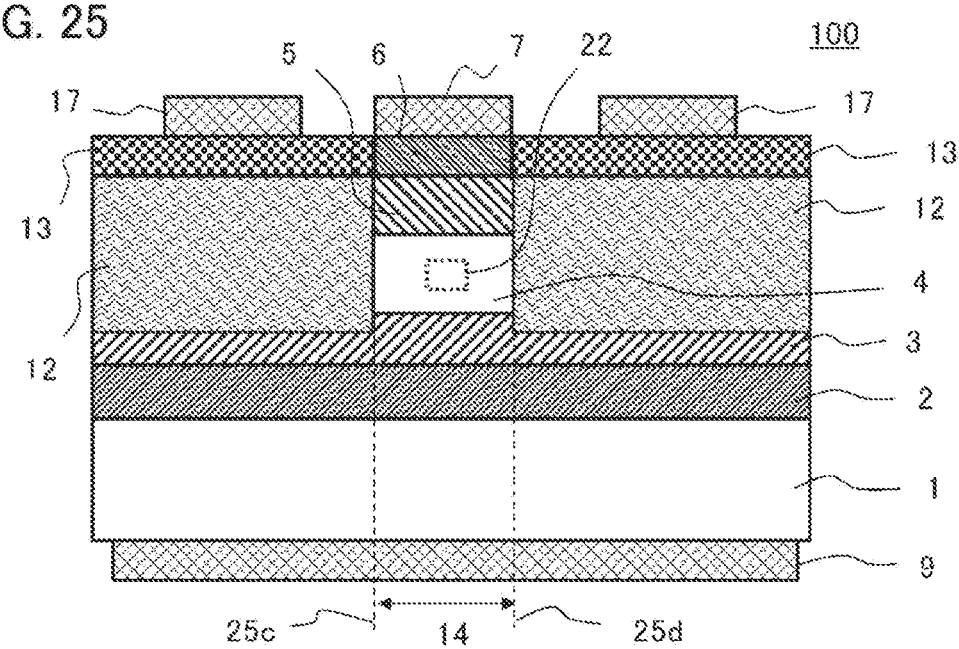
FIG. 25 is a cross-sectional view taken along the broken line C3-C3 in FIG. 22.
Figure 26:
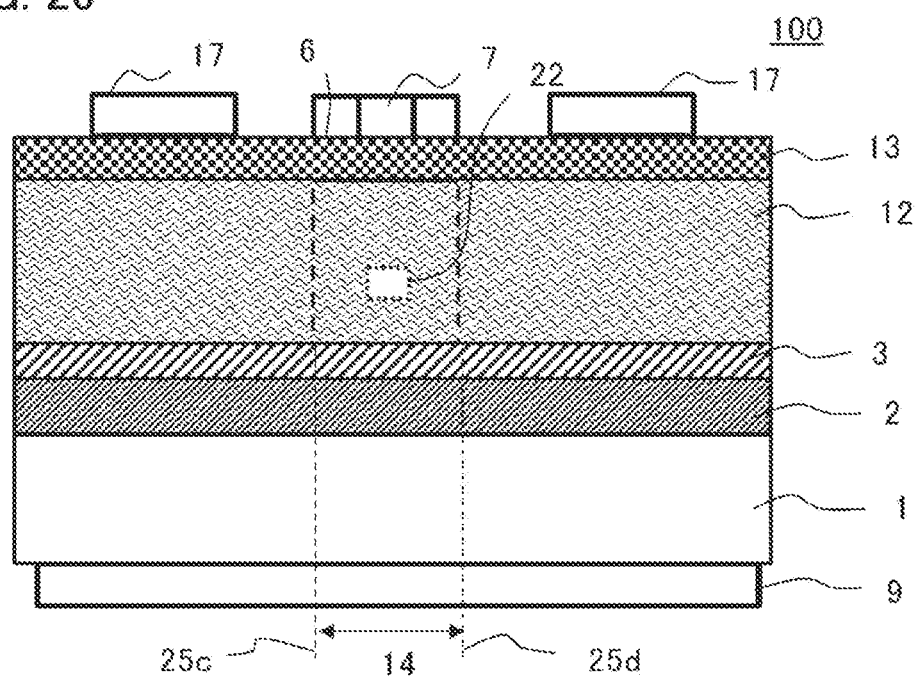
FIG. 26 is a cross-sectional view taken along the broken line F-F in FIG. 22.
Figure 27:
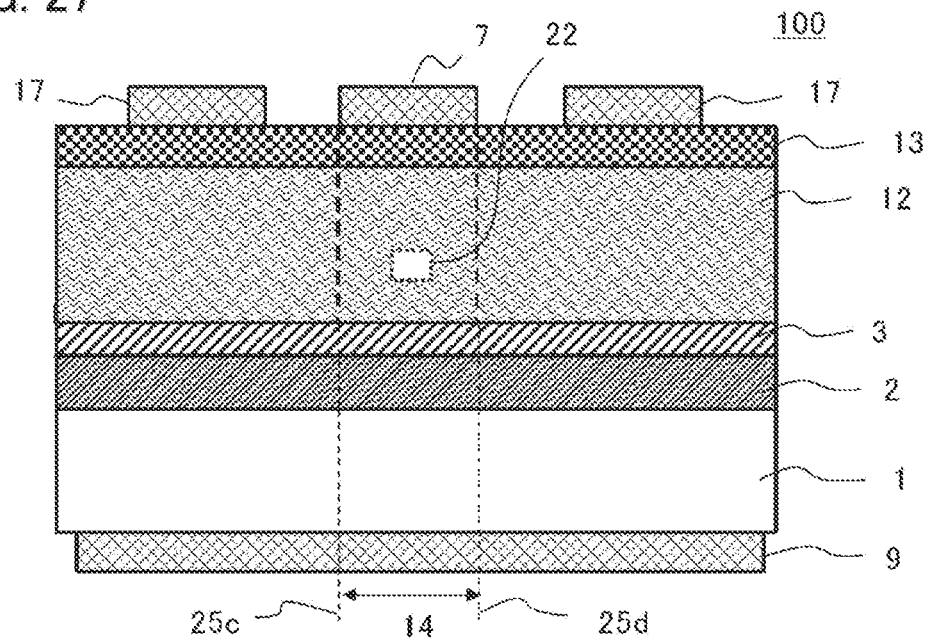
FIG. 27 is a cross-sectional view taken along the broken line G-G in FIG. 22.

FIG. 22 is a perspective view of a waveguide photodetector according to Embodiment 4, and FIG. 23 is a cross-sectional view taken along the broken line A5-A5 in FIG. 22. FIG. 24 is a cross-sectional view taken along the broken line B4-B4 in FIG. 22, and FIG. 25 is a cross-sectional view taken along the broken line C3-C3 in FIG. 22. FIG. 26 is a cross-sectional view taken along the broken line F-F in FIG. 22, and FIG. 27 is a cross-sectional view taken along the broken line G-G in FIG. 22. The waveguide photodetector 100 according to Embodiment 4 differs from the waveguide photodetector 100 according to Embodiment 1 in that a ridge portion 14 having part of the first cladding layer 3, the core layer 30, and the second cladding layer 5 is formed, and sides in the z-direction of the ridge portion 14 and sides in the x-direction thereof are buried with a buried layer 12. A part different from the waveguide photodetector 100 of Embodiment 1 will be mainly described.

The waveguide photodetector 100 of Embodiment 4 includes the semiconductor substrate 1, the stacked structure part 18 formed on the semiconductor substrate 1, the first electrode 17 and the second electrode 7. The stacked structure part 18 includes the first contact layer 2 of the first conductivity type, the ridge portion 14, and the first cladding layer 3, the buried layer 12, and the second contact layer 6 that are disposed on the outer periphery of the ridge portion 14. The range of the ridge portion 14 in the z-direction is a range between the broken line 25a and the broken line 25b. The range of the ridge portion 14 in the x-direction is a range between the broken line 25c and the broken line 25d. The first cladding layer 3 has a portion that is part of the ridge portion 14 and a portion that is not part of the ridge portion 14. The buried layer 12 covers the surfaces on the positive side in the y-direction in the first cladding layer 3, the surfaces being not included in the ridge portion 14 and covers the surfaces on the sides in the x-direction and z-direction in the ridge portion 14. The surfaces of the buried layer 12 are covered with a passivation film 13, and the surface of the second cladding layer 5 in the ridge portion 14 and the side surfaces of the second contact layer 6 are covered with the passivation film 13. The surfaces of the buried layer 12 and the surface of the second cladding layer 5 in the ridge portion 14 are on the positive side in the y-direction. The side surface of the second contact layer 6 in the ridge portion 14 is the side surface in the y-direction and the side surfaces in the z direction. In FIG. 24, the side surfaces of the second electrode 7 that are on the side apart from the cross sections of the second electrode 7 and the second contact layer 6 in the traveling direction of the signal light 20, namely, on the positive side in the z-direction, are shown in white. The inner surfaces of the first electrode 17 on the side apart from the cross section of the first electrode 17 in the traveling direction of the signal light 20, namely, on the positive side in the z-direction, is shown in white. In FIG. 26, the second electrode 7, the first electrode 17, and the back side electrode 9, which are located on the side apart from the broken line F-F in FIG. 22 in the traveling direction of the signal light 20, namely, on the positive side in the z-direction, are shown in white.

The buried layer 12 is an epitaxial layer of InP, InGaAs, InGaAsP, or the like, or a composite layer in combination of these layers. Further, the buried layer 12 may be doped with Fe or Ru. The passivation film 13 is an insulating film of $SiO_2$, SiN, or SiON, or a composite insulating film in combination of these films. The second electrode 7 is formed on the surface of the second contact layer 6 of the second conductivity type in the stacked structure part 18. The first electrode 17 is connected to the first contact layer 2 of the first conductivity type via the contact hole 19 and the passivation film 13 covering the side surface of the contact hole 19 that are formed in the buried layer 12 of the stacked structure part 18. For example, the first conductivity type is the n-type, and the second conductivity type is the p-type. Alternatively, the first conductivity type may be the p-type, and the second conductivity type may be the n-type. FIG. 22 to FIG. 27 show an example in which at least a portion of the light incident face 21 on which light is incident is covered with the anti-reflection film 10, and the whole or part of the surface on the back side of the semiconductor substrate 1 is covered with the back side electrode 9. In FIG. 22, the anti-reflection film 10 is omitted.

A method for manufacturing the waveguide photodetector 100 according to Embodiment 4 will be described. The process up to the formation of the p-type impurity-doped light absorption layer 8 is as described in Embodiment 1. Thereafter, a mask made of an insulating film is formed by a typical lithography technique. Then, by dry etching such as reactive ion etching (RIE) or wet etching, the epitaxial layer in the portion not covered with the mask of the insulating film is etched to the middle of the first cladding layer 3. Thereafter, the buried layer 12 is selectively grown on the etched portion by metalorganic vapor phase epitaxy (MO-VPE) or the like. The passivation film 13 is formed by forming the insulating film of the above-described material by a method such as plasma-enhanced chemical vapor deposition (PE-CVD) or sputtering and is formed by etching an unnecessary portion of the insulating film. When the unnecessary portion of the insulating film is etched, the etching is performed while the mask is left only at a desired portion using a typical lithography technique.

In the waveguide photodetector 100 according to Embodiment 1, the electric field tends to concentrate at the portion on the side of the light incident face 21 at the interface between the p-type impurity-doped light absorption layer 8 and the first cladding layer 3 of the n-type or the second cladding layer 5 of the n-type, that is, at an interface boundary portion, so that when intense light is incident, the portion may be structurally weak. In the waveguide photodetector 100 according to Embodiment 4, since the sides of the ridge portion 14 are buried with the buried layer 12 such that the side surfaces of the ridge portion in the x-direction and the z-direction are not exposed, the interface boundary portion where the electric field is concentrated is not formed at the end portion of the detector, and therefore, the effect of the waveguide photodetector 100 according to Embodiment 1 can be exhibited even when more intense light is incident. Further, in the waveguide photodetector 100 according to Embodiment 4, part of the lower layers of the second electrode 7 (on the right side of the broken line 25b in FIG. 23) can be the passivation film 13 and the buried layer 12, and an opposed area that is an area of the first contact layer 2 opposed to the light absorption layer 4 can be made smaller, the light absorption layer 4 being formed only in the ridge portion 14 and being the layer undoped or having the impurity concentration lower than that of the impurity-doped light absorption layer 8. Therefore, the capacitance between the second contact layer 6 connected to the second electrode 7 and the first contact layer 2 connected to the first electrode 17, that is, the capacitance of the waveguide photodetector, can be reduced. That is, since the core layer 30 having the impurity-doped light absorption layer 8 and the light absorption layer 4 is formed in the ridge portion 14 in the waveguide photodetector 100 of Embodiment 4, the capacitance of the waveguide photodetector can be reduced as compared with the waveguide photodetector 100 of Embodiment 1. Therefore, the waveguide photodetector 100 according to Embodiment 4 exhibits the effect of the waveguide photodetector 100 according to Embodiment 1, and since the capacitance of the waveguide photodetector is smaller than that of the waveguide photodetector 100 according to Embodiment 1, it is possible to improve the fast response characteristic better than that of the waveguide photodetector 100 according to Embodiment 1.

Embodiment 5

Figure 28:
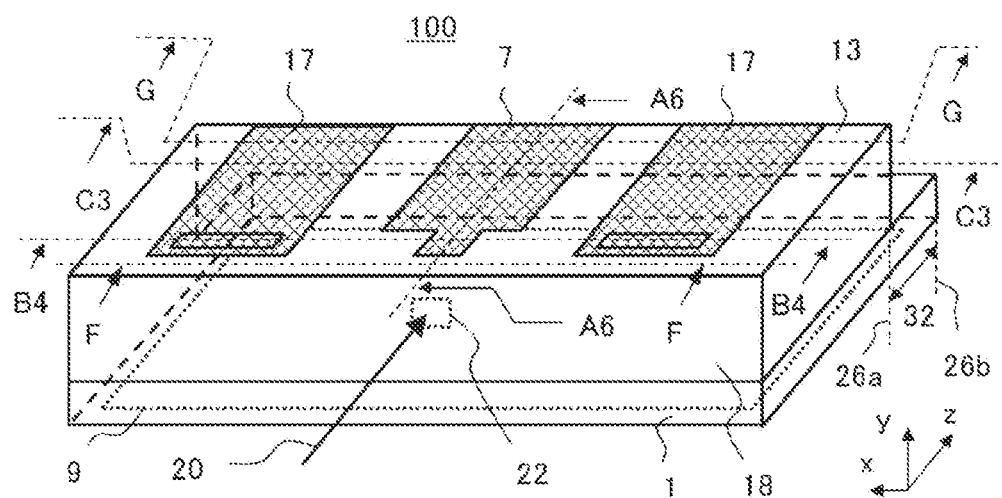
FIG. 28 is a perspective view of a waveguide photodetector according to Embodiment 5.
Figure 29:
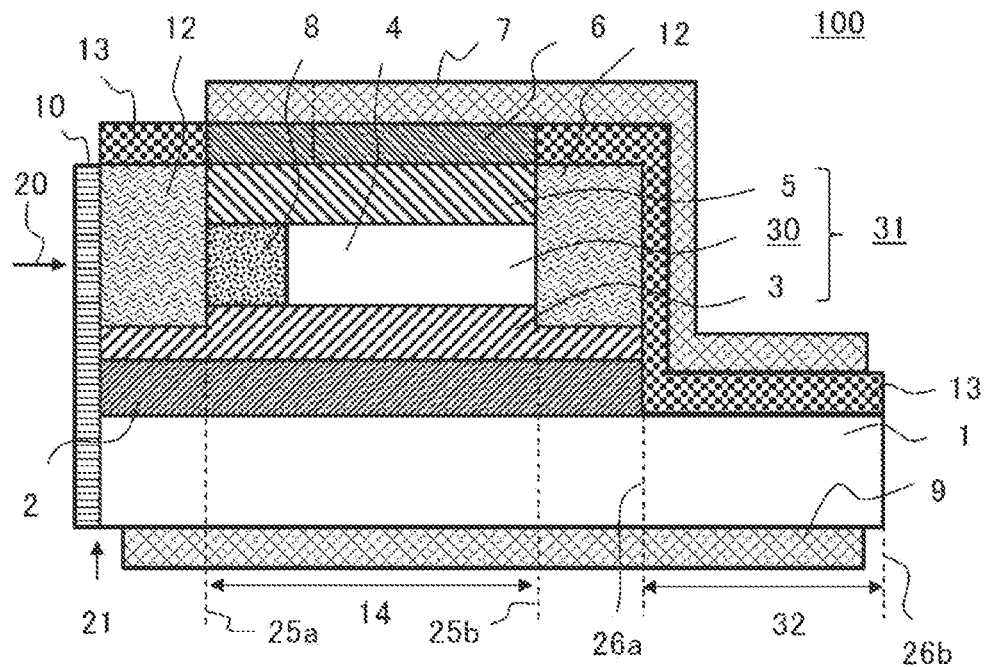
FIG. 29 is a cross-sectional view taken along the broken line A6-A6 in FIG. 28.

FIG. 28 is a perspective view of a waveguide photodetector according to Embodiment 5, and FIG. 29 is a cross-sectional view taken along the broken line A6-A6 in FIG. 28. The cross-sectional views taken along the broken lines B4-B4, C3-C3, F-F, and G-G in FIG. 28 are the same as those in FIG. 24, FIG. 25, FIG. 26, and FIG. 27, respectively. The waveguide photodetector 100 according to Embodiment 5 differs from the waveguide photodetector 100 according to Embodiment 4 in that the semiconductor substrate 1 is provided with a substrate extending portion 32 extending in the traveling direction of the signal light 20, namely, in the positive side in the z-direction. A part different from the waveguide photodetector 100 of Embodiment 4 will be mainly described.

The substrate extending portion 32 is formed by etching the stacked structure part 18 on the side opposite to the light incident face 21. The range of the substrate extending portion 32 in the z-direction is a range between the broken line 26a and the broken line 26b. The substrate extending portion 32 extends on the positive side in the z-direction from an end portion of the buried layer 12 on the positive side in the z-direction. The range of the substrate extending portion 32 in the x-direction is the same as that of the stacked structure part 18 in the x-direction. In the substrate extending portion 32, the passivation film 13 is formed on the surface of the semiconductor substrate 1, and the second electrode 7 is formed on the surface of the passivation film 13 so as to extend from an upper portion of the ridge portion 14. Similar to the second electrode 7, the first electrode 17 (not shown in FIG. 29) is also formed on the surface of the passivation film 13 so as to extend from the upper portion of the stacked structure part 18.

The substrate extending portion 32 is formed by dry etching such as RIE or wet etching after forming the stacked structure part 18 having the buried layer 12 in the waveguide photodetector according to Embodiment 4. Specifically, a mask of the insulating film or a photoresist is formed on the surface of the stacked structure part 18 by a typical lithography technique, and a portion thereof to be etched is opened in the mask, the etching is performed down to the semiconductor substrate 1 by dry etching such as RIE or wet etching. Thereafter, the passivation film 13, the second electrode 7, the first electrode 17, and the back side electrode 9 are formed.

A case is considered where the chip size of the waveguide photodetector 100 of Embodiment 5 is the same as that of the waveguide photodetector 100 of Embodiment 4. Since the waveguide photodetector 100 of Embodiment 5 is provided with the substrate extending portion 32, the area that is opposed to the semiconductor substrate 1 in the stacked structure part 18 in which the ridge portion 14 is formed therein is smaller than that of the waveguide photodetector 100 of Embodiment 4. Therefore, in the waveguide photodetector 100 according to Embodiment 5, since the opposed area that is an area of the first contact layer 2 opposed to the light absorption layer 4 can be made smaller than that of the waveguide photodetector 100 according to Embodiment 4, the light absorption layer 4 being formed only in the ridge portion 14 and being the layer undoped or having the impurity concentration lower than that of the impurity-doped light absorption layer 8. Therefore, the capacitance between the second contact layer 6 connected to the second electrode and the first contact layer 2 connected to the first electrode 17, that is, the capacitance of the waveguide photodetector, can be made smaller than that of the waveguide photodetector 100 according to Embodiment 4. The waveguide photodetector 100 according to Embodiment 5 exhibits the effect of the waveguide photodetector 100 according to Embodiment 4, and since the capacitance of the waveguide photodetector is smaller than that of the waveguide photodetector 100 according to Embodiment 4, it is possible to improve the fast response characteristic better than that of the waveguide photodetector 100 according to Embodiment 4.

Embodiment 6

Figure 30:
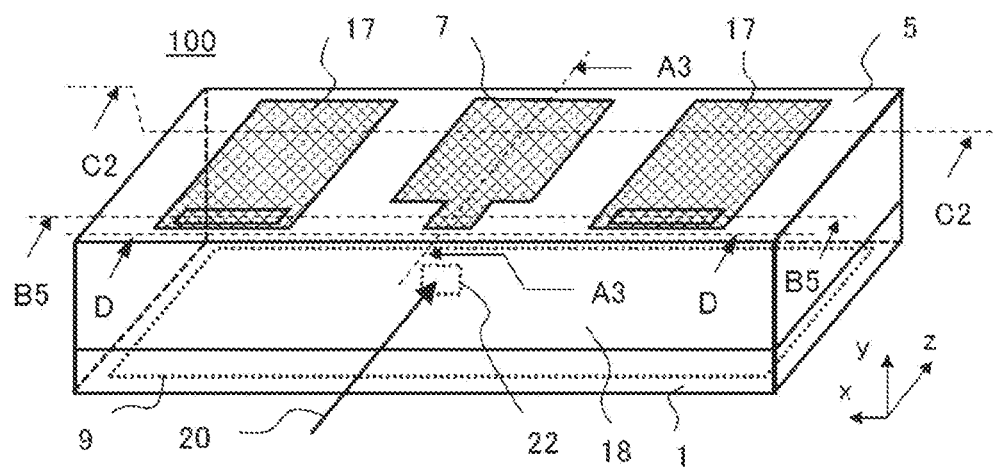
FIG. 30 is a perspective view of a waveguide photodetector according to Embodiment 6.
Figure 31:
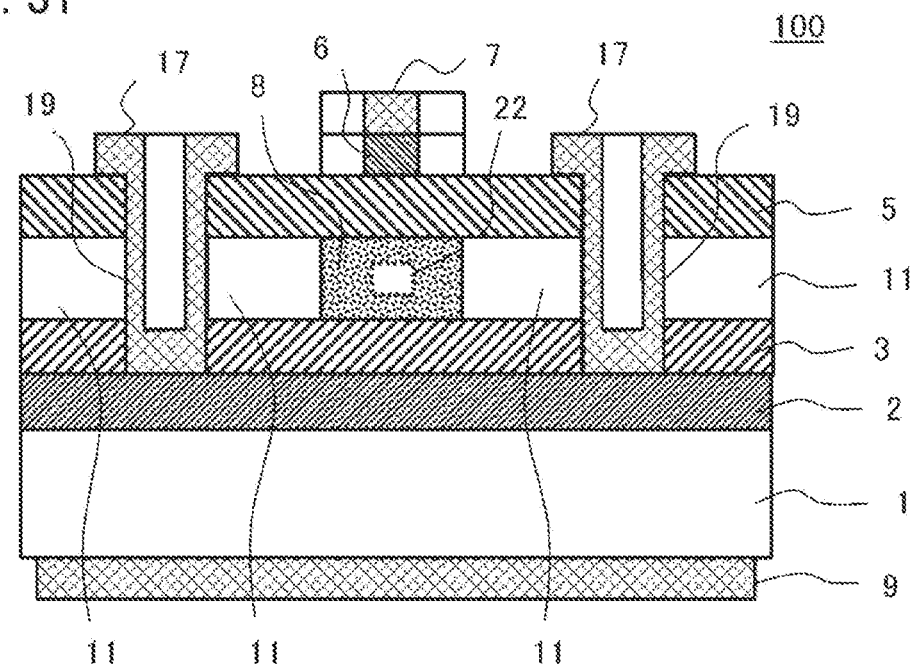
FIG. 31 is a cross-sectional view taken along the broken line B5-B5 in FIG. 30.
Figure 32:
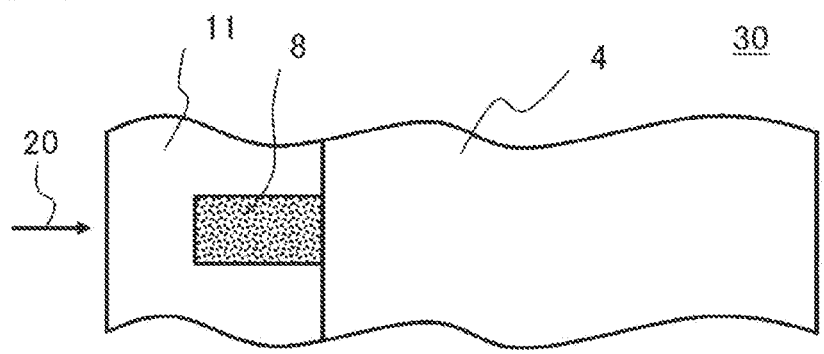
FIG. 32 is a front surface view of a core layer in FIG. 30.

FIG. 30 is a perspective view of the waveguide photodetector according to Embodiment 6. FIG. 31 is a cross-sectional view taken along the broken line B5-B5 in FIG. 30, and FIG. 32 is a front surface view of the core layer in FIG. 30. Cross-sectional views taken along the broken lines A3-A3, C2-C2, and D-D in FIG. 30 are the same as those in FIG. 14, FIG. 8, and FIG. 15, respectively. The waveguide photodetector 100 according to Embodiment 6 differs from the waveguide photodetector 100 according to Embodiment 2 in that the undoped light absorption layer 11 is formed on the sides of the p-type impurity-doped light absorption layer 8 in the x-direction. A part different from the waveguide photodetector 100 of Embodiment 2 will be mainly described.

In the waveguide photodetector 100 according to Embodiment 6, the undoped light absorption layer 11 is formed between the p-type impurity-doped light absorption layer 8 and the light incident face 21, and also the undoped light absorption layer 11 is formed in the sides parallel to the traveling direction of the signal light 20, that is, on the sides in the x-direction. Therefore, the core layer 30 of the waveguide photodetector 100 according to Embodiment 6 has the undoped light absorption layer 11 on the sides of the impurity-doped light absorption layer 8 in the z-direction in which the signal light 20 travels and in the x-direction perpendicular to the y-direction perpendicular to the semiconductor substrate 1.

In the waveguide photodetector 100 according to Embodiment 2, since the electric field tends to concentrate at the corner portion of the interface between the p-type impurity-doped light absorption layer 8 and the first cladding layer 3 of the n-type or the second cladding layer 5 of the n-type, that is, at the interface boundary portion extending in the x-direction on the side of the light incident face 21, when intense light is incident, the portion may be structurally weak. In the waveguide photodetector 100 according to Embodiment 6, since the interface boundary portion where the electric field is concentrated can be made smaller than that of the waveguide photodetector 100 according to Embodiment 2, the structural strength can be maintained even when more intense light is incident as compared with the waveguide photodetector 100 according to Embodiment 2.

Since the waveguide photodetector 100 according to Embodiment 6 is the same as the waveguide photodetector 100 according to Embodiment 2 except that the undoped light absorption layer 11 is formed on the sides of the p-type impurity-doped light absorption layer 8 in the x-direction, the same effect as the waveguide photodetector 100 according to Embodiment 2 can be obtained. Furthermore, the waveguide photodetector 100 according to Embodiment 6 can maintain its structural strength and improve its reliability even when more intense light is incident as compared with the waveguide photodetector 100 according to Embodiment 2.

Embodiment 7

Figure 33:
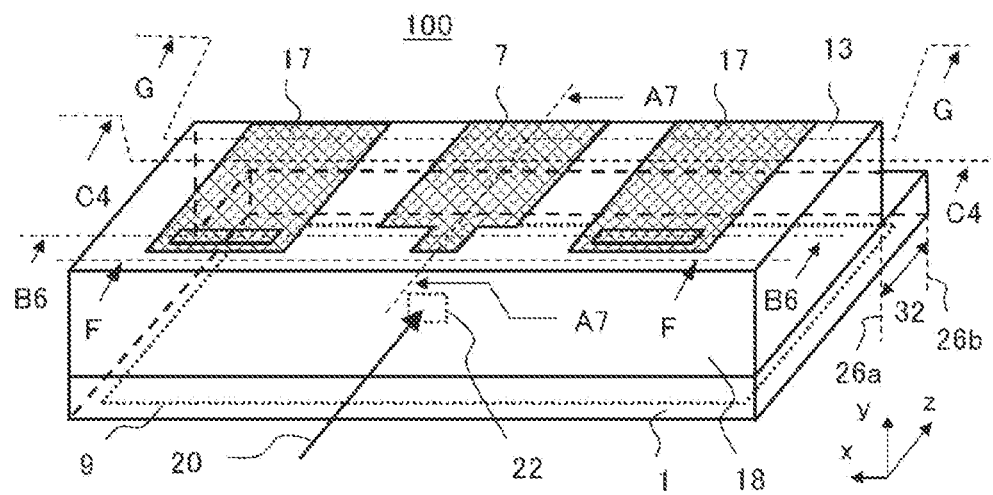
FIG. 33 is a perspective view of a waveguide photodetector according to Embodiment 7.
Figure 34:
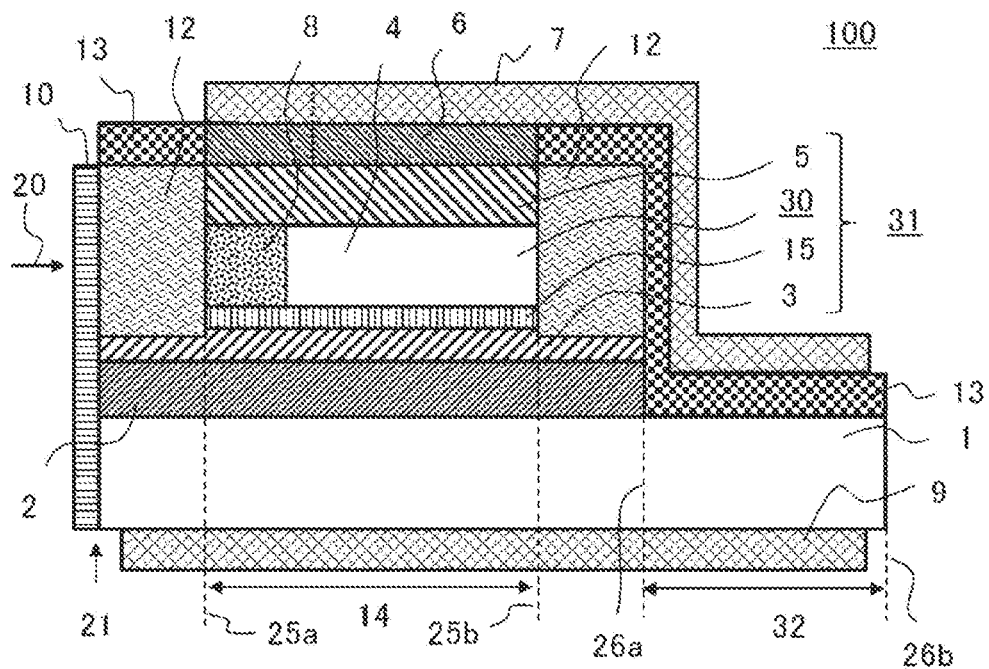
FIG. 34 is a cross-sectional view taken along the broken line A7-A7 in FIG. 33.
Figure 35:
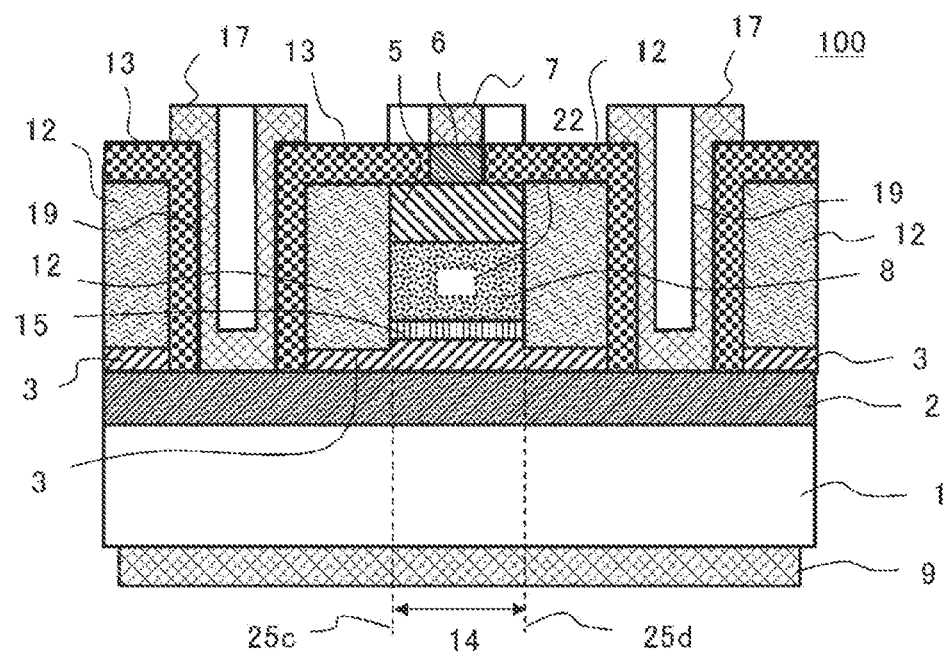
FIG. 35 is a cross-sectional view taken along the broken line B6-B6 in FIG. 33.
Figure 36:
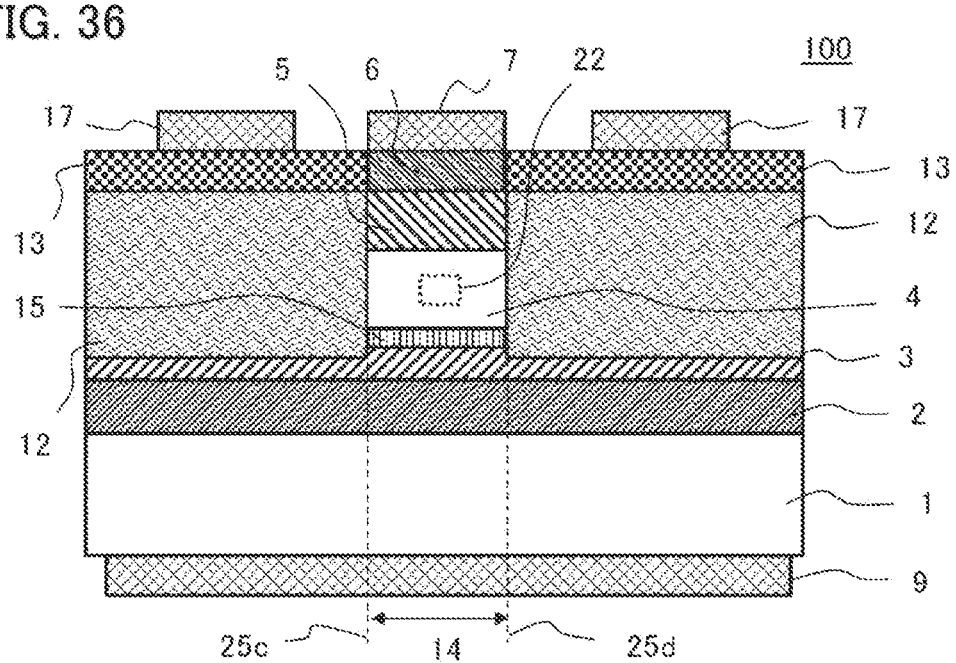
FIG. 36 is a cross-sectional view taken along the broken line C4-C4 in FIG. 33.

FIG. 33 is a perspective view of a waveguide photodetector according to Embodiment 7, and FIG. 34 is a cross-sectional view taken along the broken line A7-A7 in FIG. 33. FIG. 35 is a cross-sectional view taken along the broken line B6-B6 in FIG. 33, and FIG. 36 is a cross-sectional view taken along the broken line C4-C4 in FIG. 33. Cross-sectional views taken along the broken lines F-F and G-G in FIG. 33 are the same as those in FIG. 26 and FIG. 27, respectively. The waveguide photodetector 100 according to Embodiment 7 differs from the waveguide photodetector 100 according to Embodiment 5 in that an electron transport layer 15 is disposed between the core layer 30 and the first cladding layer 3 of the n-type or the second cladding layer 5 of the n-type. Note that, in FIG. 34 to FIG. 36, an example in which the first conductivity type is the n-type, and the second conductivity type is the p-type, is shown. Further, in a waveguide photodetector 100 according to Embodiment 3 (a variation example of the waveguide photodetector 100 according to Embodiment 3) in which a modification is made so as to include the ridge portion 14 and the substrate extending portion 32 in the same manner as in the waveguide photodetector 100 according to Embodiment 5, the waveguide photodetector 100 according to Embodiment 7 can be described as a structure in which the electron transport layer 15 is disposed between the core layer 30 and the first cladding layer 3 of the n-type or the second cladding layer 5 of the n-type. A part different from the waveguide photodetector 100 of Embodiment 5 and the waveguide photodetector 100 of Embodiment 3 will be mainly described.

The electron transport layer 15 is an undoped epitaxial layer and does not absorb light as its property, namely, no light absorption property. The electron transport layer 15 is, for example, InP, InGaAsP, AlInAs, AlGaInAs or the like. Since the electron transport layer 15 has no light absorption property, electrons of the photocarriers travel through the electron transport layer 15. The first cladding layer 3, the electron transport layer 15, the core layer 30, and the second cladding layer 5 constitute the waveguide layer 31.

A method for reducing the capacitance of the waveguide photodetector to a value lower than that of the waveguide photodetector 100 according to Embodiment 5 will be considered. As described in Embodiment 3, by forming the light absorption layer 4 between the p-type impurity-doped light absorption layer 8 and the first cladding layer 3 of the n-type or the second cladding layer 5 of the n-type, the region in the light absorption layer 4 that is undoped or the light absorption layer 4 with the impurity concentration lower than that of the impurity-doped light absorption layer 8 is wider, so that the capacitance can be reduced. However, in the waveguide photodetector 100 according to Embodiment 3, there are photocarriers generated in the region on the side of the light incident face 21 where the light absorption layer 4 is left, and thus there is a room for further improving the fast response characteristic by suppressing the stay of the holes.

In the waveguide photodetector 100 according to Embodiment 3, since the light absorption layer 4 is formed between the p-type impurity-doped light absorption layer 8 and the first cladding layer 3 of the n-type or the second cladding layer 5 of the n-type, a small number of holes exist in the light absorption layer 4 having a short length in the y-direction on the side of the light incident face 21. In the waveguide photodetector 100 according to Embodiment 7, unlike the waveguide photodetector 100 according to Embodiment 3 and the variation example of the waveguide photodetector 100 according to Embodiment 3, the signal light 20 does not pass through the light absorption layer 4 on the positive side in the y-direction or the light absorption layer 4 on the negative side in the y-direction with respect to the p-type impurity-doped light absorption layer 8, and the electron transport layer 15 has no light absorption property, so that the signal light 20 is entirely absorbed by the p-type impurity-doped light absorption layer 8. Therefore, the waveguide photodetector 100 of Embodiment 7 can improve the fast response characteristic compared with the waveguide photodetector 100 of Embodiment 5 and the variation example of the waveguide photodetector 100 of Embodiment 3.

Further, since the electron transport layer 15 is undoped, which is similar to the region of the light absorption layer 4 that is undoped or the light absorption layer 4 with the impurity concentration lower than that of the impurity-doped light absorption layer 8 as described in Embodiment 3, the region of the undoped electron transport layer 15 is wider. Therefore, the capacity of the waveguide photodetector 100 of Embodiment 7 can be made lower than that of the waveguide photodetector 100 of Embodiment 5. Therefore, the waveguide photodetector 100 according to Embodiment 7 can exhibits the effect of the waveguide photodetector 100 according to Embodiment 5 and achieve a higher speed operation than the waveguide photodetector 100 according to Embodiment 5.

Although an example is described in which the first conductivity type is the n-type and the second conductivity type is the p-type in FIG. 34 to FIG. 36, the first conductivity type may be the p-type and the second conductivity type may be the n-type. In this case, the electron transport layer 15 is formed between the second cladding layer 5 of the n-type and the core layer 30. That is, in FIG. 34 to FIG. 36, the electron transport layer 15 disposed between the first cladding layer 3 and the core layer 30 is moved to be disposed between the second cladding layer 5 of the n-type and the core layer 30.

In the waveguide photodetector 100 according to Embodiment 3, the electron transport layer 15 instead of the light absorption layer 4 may be formed between the p-type impurity-doped light absorption layer 8 and the first cladding layer 3 of the n-type or the second cladding layer 5 of the n-type. In this case, since the light absorption layer 4 on the positive side in the y-direction or the light absorption layer 4 on the negative side in the y-direction with respect to the p-type impurity-doped light absorption layer 8 is substituted for the electron transport layer 15 that is undoped and has no light absorption property, the fast response characteristic can be improved.

Note that, although various exemplary embodiments and examples are described in the present application, various features, aspects, and functions described in one or more embodiments are not inherent in a particular embodiment and can be applicable alone or in their various combinations to each embodiment. Accordingly, countless variations that are not illustrated are envisaged within the scope of the art disclosed herein. For example, the case where at least one component is modified, added or omitted, and the case where at least one component is extracted and combined with a component in another embodiment are included.

DESCRIPTION OF REFERENCE NUMERALS AND SIGNS

1: semiconductor substrate, 2: first contact layer, 3: first cladding layer, 4: light absorption layer, 5: second cladding layer, 6: second contact layer, 8: impurity-doped light absorption layer, 11: undoped light absorption layer, 12: buried layer, 14: ridge portion, 15: electron transport layer, 21: light incident face, 30: core layer, 31: waveguide layer, 32: substrate extending portion, 42: first contact layer, 43: first cladding layer, 45: second cladding layer, 46: second contact layer, 100: waveguide photodetector, 1a: length, 1b: length

The invention claimed is:

1. A waveguide photodetector in which a waveguide layer having a core layer for absorbing light is formed on a semiconductor substrate, the waveguide photodetector comprising:
   a first contact layer of a first conductivity type, the waveguide layer, and a second contact layer of a second conductivity type that are sequentially formed on the semiconductor substrate, wherein
   the waveguide layer comprises a first cladding layer of the first conductivity type disposed on a side of the first contact layer, a second cladding layer of the second conductivity type disposed on a side of the second contact layer, and the core layer disposed between the first cladding layer and the second cladding layer,
   the core layer comprises a light absorption layer and an impurity-doped light absorption layer that has a higher concentration of a p-type impurity than that of the light absorption layer and is disposed on a side of a light incident face on which signal light is incident in a light propagating direction, and
   an end face of the impurity-doped light absorption layer faces at least a portion of the light absorption layer in the light propagating direction.

2. The waveguide photodetector according to claim 1, wherein
   the first conductivity type and the second conductivity type are n-type and p-type, respectively, and
   the light absorption layer is disposed between the first cladding layer and the impurity-doped light absorption layer.

3. The waveguide photodetector according to claim 2, wherein the light absorption layer is undoped.

4. The waveguide photodetector according to claim 2, further comprising:
a ridge portion that includes part of the first cladding layer on a positive side in a y-direction, the core layer, and the second cladding layer and is a ridge extending in a z-direction; and
a buried layer that covers a surface of the first cladding layer on the positive side in the y-direction, the surface being not included in the ridge portion, and covers a side surface in the z-direction and a side surface in an x-direction in the ridge portion, wherein
the light propagating direction is the z-direction, a direction perpendicular to the semiconductor substrate is the y-direction, and a direction perpendicular to the z-direction and the y-direction is the x-direction.

5. The waveguide photodetector according to claim 1, wherein
the first conductivity type and the second conductivity type are p-type and n-type, respectively, and
the light absorption layer is disposed between the second cladding layer and the impurity-doped light absorption layer.

6. The waveguide photodetector according to claim 5, wherein the light absorption layer is undoped.

7. The waveguide photodetector according to claim 5, further comprising:
a ridge portion that includes part of the first cladding layer on a positive side in a y-direction, the core layer, and the second cladding layer and is a ridge extending in a z-direction; and
a buried layer that covers a surface of the first cladding layer on the positive side in the y-direction, the surface being not included in the ridge portion, and covers a side surface in the z-direction and a side surface in an x-direction in the ridge portion, wherein
the light propagating direction is the z-direction, a direction perpendicular to the semiconductor substrate is the y-direction, and a direction perpendicular to the z-direction and the y-direction is the x-direction.

8. The waveguide photodetector according to claim 1, wherein
the first conductivity type and the second conductivity type are n-type and p-type, respectively, and
an electron transport layer of no light absorption property that does not absorb light is disposed between the first cladding layer and the core layer.

9. The waveguide photodetector according to claim 8, wherein the light absorption layer is undoped.

10. The waveguide photodetector according to claim 8, further comprising:
a ridge portion that includes part of the first cladding layer on a positive side in a y-direction, the core layer, and the second cladding layer and is a ridge extending in a z-direction; and
a buried layer that covers a surface of the first cladding layer on the positive side in the y-direction, the surface being not included in the ridge portion, and covers a side surface in the z-direction and a side surface in an x-direction in the ridge portion, wherein
the light propagating direction is the z-direction, a direction perpendicular to the semiconductor substrate is the y-direction, and a direction perpendicular to the z-direction and the y-direction is the x-direction.

11. The waveguide photodetector according to claim 1, wherein
the first conductivity type and the second conductivity type are p-type and n-type, respectively, and
an electron transport layer of no light absorption property that does not absorb light is disposed between the second cladding layer and the core layer.

12. The waveguide photodetector according to claim 11, wherein the light absorption layer is undoped.

13. The waveguide photodetector according to claim 11, further comprising:
a ridge portion that includes part of the first cladding layer on a positive side in a y-direction, the core layer, and the second cladding layer and is a ridge extending in a z-direction; and
a buried layer that covers a surface of the first cladding layer on the positive side in the y-direction, the surface being not included in the ridge portion, and covers a side surface in the z-direction and a side surface in an x-direction in the ridge portion, wherein
the light propagating direction is the z-direction, a direction perpendicular to the semiconductor substrate is the y-direction, and a direction perpendicular to the z-direction and the y-direction is the x-direction.

14. The waveguide photodetector according to claim 1, wherein the light absorption layer is undoped.

15. The waveguide photodetector according to claim 1, further comprising:
a ridge portion that includes part of the first cladding layer on a positive side in a y-direction, the core layer, and the second cladding layer and is a ridge extending in a z-direction; and
a buried layer that covers a surface of the first cladding layer on the positive side in the y-direction, the surface being not included in the ridge portion, and covers a side surface in the z-direction and a side surface in an x-direction in the ridge portion, wherein
the light propagating direction is the z-direction, a direction perpendicular to the semiconductor substrate is the y-direction, and a direction perpendicular to the z-direction and the y-direction is the x-direction.

16. The waveguide photodetector according to claim 15, further comprising:
a substrate extending portion in which the semiconductor substrate extends on the positive side in the z-direction from an end portion of the buried layer on the positive side in the z-direction.

17. The waveguide photodetector according to claim 1, wherein a length of the impurity-doped light absorption layer is 2 to 3 μm in the light propagating direction.

18. A waveguide photodetector in which a waveguide layer having a core layer for absorbing light is formed on a semiconductor substrate, the waveguide photodetector comprising:
a first contact layer of a first conductivity type, the waveguide layer, and a second contact layer of a second conductivity type that are sequentially formed on the semiconductor substrate, wherein
the waveguide layer comprises a first cladding layer of the first conductivity type disposed on a side of the first contact layer, a second cladding layer of the second conductivity type disposed on a side of the second contact layer, and the core layer disposed between the first cladding layer and the second cladding layer,
the core layer comprises a light absorption layer and an impurity-doped light absorption layer that has a higher concentration of a p-type impurity than that of the light absorption layer and is disposed on a side of a light incident face on which signal light is incident, and the core layer includes an undoped light absorption layer that is disposed closer to the light incident face than the impurity-doped light absorption layer and absorbs light in an undoped state.

19. The waveguide photodetector according to claim 18, wherein the core layer includes the undoped light absorption layer on sides of the impurity-doped light absorption layer in z-direction in which the signal light travels and in an x-direction perpendicular to a y-direction perpendicular to the semiconductor substrate.

20. The waveguide photodetector according to claim 18, wherein a length of the undoped light absorption layer disposed on a side of the light incident face is 10 to 50 nm in a traveling direction of the signal light.

\* \* \* \* \*